United States Patent
Fox et al.

(10) Patent No.: US 8,895,415 B1
(45) Date of Patent: Nov. 25, 2014

(54) TENSILE STRESSED DOPED AMORPHOUS SILICON

(71) Applicant: Novellus Systems, Inc., Fremont, CA (US)

(72) Inventors: Keith Fox, Tigard, OR (US); Dong Niu, West Linn, OR (US); Joseph L. Womack, Tigard, OR (US)

(73) Assignee: Novellus Systems, Inc., Fremont, CA (US)

( * ) Notice: Subject to any disclaimer, the term of this patent is extended or adjusted under 35 U.S.C. 154(b) by 0 days.

(21) Appl. No.: 13/907,742

(22) Filed: May 31, 2013

(51) Int. Cl.
*H01L 21/205* (2006.01)
*H01L 21/02* (2006.01)

(52) U.S. Cl.
CPC .... *H01L 21/02694* (2013.01); *H01L 21/02274* (2013.01); *H01L 21/02211* (2013.01); *H01L 21/02507* (2013.01); *H01L 21/0217* (2013.01); *H01L 21/02123* (2013.01); *H01L 21/02532* (2013.01)
USPC ........... 438/485; 438/482; 438/486; 438/488; 438/507; 438/761; 438/763

(58) Field of Classification Search
CPC ............... H01L 21/02274; H01L 21/02123; H01L 21/0217; H01L 21/02211; H01L 21/02507; H01L 21/02532; H01L 21/0245
USPC ......... 438/485, 482, 486, 488, 507, 763, 764, 438/508, 509
See application file for complete search history.

(56) References Cited

U.S. PATENT DOCUMENTS

| | | |
|---|---|---|
| 5,399,387 A | 3/1995 | Law et al. |
| 5,589,233 A | 12/1996 | Law et al. |
| 5,851,602 A | 12/1998 | Law et al. |
| 6,066,550 A | 5/2000 | Wang |
| 6,087,278 A | 7/2000 | Kim et al. |
| 6,207,574 B1 | 3/2001 | Lee |
| 6,235,650 B1 | 5/2001 | Yao |
| 6,358,573 B1 | 3/2002 | Raoux et al. |
| 6,407,011 B1 | 6/2002 | Ikeda et al. |

(Continued)

FOREIGN PATENT DOCUMENTS

| | | |
|---|---|---|
| DE | 101 43 235 A1 | 3/2003 |
| EP | 0 394 054 | 10/1990 |

(Continued)

OTHER PUBLICATIONS

U.S. Appl. No. 13/671,424, filed Nov. 7, 2012, entitled "In-Situ Deposition of Film Stacks," Haverkamp et al.

(Continued)

*Primary Examiner* — Michael Trinh
(74) *Attorney, Agent, or Firm* — Weaver Austin Villeneuve & Sampson LLP

(57) ABSTRACT

The method and apparatus disclosed herein relate to preparing a stack structure for an electronic device on a semiconductor substrate. A particularly beneficial application of the method is in reduction of internal stress in a stack containing multiple layers of silicon. Typically, though not necessarily, the internal stress is a compressive stress, which often manifests as wafer bow. In some embodiments, the method reduces the internal stress of a work piece by depositing phosphorus doped silicon layers having low internal compressive stress or even tensile stress. The method and apparatus disclosed herein can be used to reduce compressive bow in stacks containing silicon.

20 Claims, 28 Drawing Sheets

(56) References Cited

U.S. PATENT DOCUMENTS

| | | | |
|---|---|---|---|
| 6,444,277 B1* | 9/2002 | Law et al. | 427/574 |
| 6,811,831 B1 | 11/2004 | Koutny et al. | |
| 6,818,533 B2 | 11/2004 | Chen et al. | |
| 6,962,859 B2 | 11/2005 | Todd et al. | |
| 7,422,776 B2 | 9/2008 | Yim et al. | |
| 7,608,300 B2 | 10/2009 | Bencher et al. | |
| 7,635,651 B2 | 12/2009 | Lee et al. | |
| 7,858,431 B2 | 12/2010 | Isaka et al. | |
| 8,076,250 B1 | 12/2011 | Rajagopalan et al. | |
| 8,318,575 B2* | 11/2012 | Lehnert et al. | 438/386 |
| 8,709,551 B2* | 4/2014 | Fox et al. | 427/578 |
| 8,741,394 B2* | 6/2014 | Haverkamp et al. | 427/569 |
| 2001/0007245 A1 | 7/2001 | Weichart | |
| 2002/0011656 A1 | 1/2002 | Swanson et al. | |
| 2004/0011279 A1 | 1/2004 | Joo | |
| 2004/0087079 A1 | 5/2004 | Chen et al. | |
| 2004/0146661 A1 | 7/2004 | Kapoor et al. | |
| 2005/0040456 A1 | 2/2005 | Specht et al. | |
| 2005/0045099 A1 | 3/2005 | Bencher et al. | |
| 2005/0196960 A1 | 9/2005 | Koo et al. | |
| 2005/0229848 A1 | 10/2005 | Shinriki et al. | |
| 2005/0233591 A1 | 10/2005 | Schmitt et al. | |
| 2006/0204673 A1 | 9/2006 | Takayasu et al. | |
| 2006/0276011 A1 | 12/2006 | Fogel et al. | |
| 2007/0059942 A1 | 3/2007 | Hu et al. | |
| 2007/0110918 A1 | 5/2007 | Yuda et al. | |
| 2007/0144215 A1 | 6/2007 | Kharas | |
| 2007/0215877 A1 | 9/2007 | Kato et al. | |
| 2007/0264842 A1 | 11/2007 | Kim | |
| 2008/0050883 A1 | 2/2008 | Enicks | |
| 2008/0073645 A1 | 3/2008 | Todd et al. | |
| 2008/0113521 A1 | 5/2008 | Tanaka et al. | |
| 2008/0153300 A1 | 6/2008 | Bok | |
| 2008/0202688 A1 | 8/2008 | Wu et al. | |
| 2008/0268176 A1 | 10/2008 | Choi et al. | |
| 2008/0299747 A1 | 12/2008 | Arai et al. | |
| 2009/0022908 A1 | 1/2009 | Yang et al. | |
| 2009/0095221 A1 | 4/2009 | Tam et al. | |
| 2009/0097105 A1 | 4/2009 | Hart et al. | |
| 2009/0104790 A1 | 4/2009 | Liang | |
| 2009/0159119 A1 | 6/2009 | Basol | |
| 2009/0246942 A1 | 10/2009 | Imaeda et al. | |
| 2009/0286402 A1 | 11/2009 | Xia et al. | |
| 2010/0012030 A1 | 1/2010 | Todd et al. | |
| 2010/0102359 A1 | 4/2010 | Khan et al. | |
| 2010/0109065 A1 | 5/2010 | Oh et al. | |
| 2010/0184302 A1 | 7/2010 | Lee et al. | |
| 2010/0210093 A1 | 8/2010 | Kato et al. | |
| 2011/0018044 A1 | 1/2011 | Lim et al. | |
| 2011/0036168 A1 | 2/2011 | Lin | |
| 2011/0151142 A1 | 6/2011 | Seamons et al. | |
| 2011/0236594 A1 | 9/2011 | Haverkamp et al. | |
| 2011/0236600 A1 | 9/2011 | Fox et al. | |
| 2012/0142172 A1* | 6/2012 | Fox et al. | 438/478 |
| 2013/0157466 A1 | 6/2013 | Fox et al. | |
| 2013/0171834 A1 | 7/2013 | Haverkamp et al. | |
| 2013/0267081 A1 | 10/2013 | Fox et al. | |
| 2013/0316518 A1* | 11/2013 | Hollister et al. | 438/478 |

FOREIGN PATENT DOCUMENTS

| | | |
|---|---|---|
| JP | 06-240459 A | 8/1994 |
| JP | 2000-208422 | 7/2000 |
| WO | WO 2009/098548 | 8/2009 |
| WO | WO 2012/036808 | 3/2012 |
| WO | WO 2013/123143 | 8/2013 |

OTHER PUBLICATIONS

U.S. Appl. No. 13/766,696, filed Feb. 13, 2013, entitled "Silicon-Nitride Films for Semiconductor Device Applications," Fox et al.

U.S. Appl. No. 13/478,999, filed May 23, 2012, entitled "PECVD Deposition of Smooth Silicon Films," Hollister et al.

U.S. Appl. No. 13/667,282, filed Nov. 2, 2012, entitled "Flow Balancing in Gas Distribution Networks," Womack et al.

US Office Action dated Nov. 26, 2012 issued in U.S. Appl. No. 12/970,846.

US Final Office Action dated May 16, 2013 issued in U.S. Appl. No. 12/970,846.

US Office Action dated Sep. 11, 2013 issued in U.S. Appl. No. 12/970,846.

US Office Action dated Apr. 9, 2013 issued in U.S. Appl. No. 12/970,853.

US Final Office Action dated Aug. 9, 2013 issued in U.S. Appl. No. 12/970,853.

Singapore Search Report and Written Opinion dated Apr. 18, 2013, issued in SG 201102162-3.

PCT International Search Report and Written Opinion dated Apr. 9, 2012, issued in PCT/US2011/047107.

PCT International Preliminary Report on Patentability and Written Opinion dated Mar. 28, 2013, issued in PCT/US2011/047107.

PCT International Search Report and Written Opinion dated Jun. 3, 2013, issued in PCT/US2013/026069.

"Diaphragm Valves," (Oct. 2003) *Microelectronics Product Line, Catalog 4505/USA*, Parker Hannifin Corporation, pp. 1-49.

Han et al. (Jun. 1994) "Modeling the Properties of PECVD Silicon Dioxide Films Using Optimzed Back-Propagation Neural Networks," IEE Transaction on Components, Packaging, and Manufacturing Technology—Part A, 17(2):174-182.

Jang, J., et al., "Vertical Cell Array Using TCAT (Terabit Cell Array Transistor) Technology for Ultra High Density NAND Flash Memory," *2009 Symposium on VLSI Technology Digest of Technical Papers*, 2009, pp. 192-193.

Kim, J., et al., "Novel Vertical-Stacked-Array-Transistor (VSAT) for Ultra-High-Density and Cost-Effective NAND Flash Memory Devices and SSD (Sold State Drive)," *2009 Symposium on VLSI Technology Digest of Technical Papers*, 2009, pp. 186-187.

Kim, W., et al., "Multi-Layered Vertical Gate NAND Flash Overcoming Stacking Limit for Terabit Density Storage," *2009 Symposium on VLSI Technology Digest of Technical Papers*, 2009, pp. 188-189.

Moisan, M., et al., (Oct. 1987) "New surface wave launchers for sustaining plasma columns at submicrowave frequencies (1-300 MHz)" *Rev. Sci. Instrum.* 58(10):1895-1900.

Ong, Y. et al., Process Analysis and Optimization on PECVD Amorphous Silicon on Glass Substrate, *Journal of Physics: Conference Series*, vol. 34, 2006, pp. 812-817.

Hoogeland et al., (2009) "Plasma-assisted atomic layer deposition of $TiN/AI_2O_3$ stacks for metal-oxide-semiconductor capacitor applications," *Journal of Applied Physics* 106, 114107-1-114107-7, 7pp.

Schmidt et al., (2001) "Surface Passivation of silicon solar cells using plasma-enhanced chemical-vapour-deposited SiN films and thin thermal $SiO_2$/plasma SiN stacks." *Semicond. Sci. Technol.*, 16:164-170.

Su, Chen-Yi, et al., (2012) "Deposition and characterization of MgO/Si gate stacks grown by molecular beam epitaxy," *Thin Solid Films* 520:4508-4511.

Viana et al. (Jun. 2001) "Analysis of $SiO_2$ Thin Film Deposited by PECVD using an Oxygen-TEOS-Argon Mixture," *Brazilian Journal of Physics*, 31(2):299-303.

U.S. Appl. No. 14/262,196, filed Apr. 25, 2014, entitled "In-Situ Deposition of Film Stacks," Haverkamp et al. [NOVLP415D1].

US Notice of Allowance dated Jan. 24, 2014 issued in U.S. Appl. No. 12/970,846 [NOVLP415].

US Office Action dated Feb. 28, 2014 issued in U.S. Appl. No. 13/671,424 [NOVLP415X1].

US Notice of Allowance dated Jul. 14, 2014 issued in U.S. Appl. No. 13/671,424 [NOVLP415X1].

US Notice of Allowance dated Dec. 18, 2013 issued in U.S. Appl. No. 12/970,853 [NOVLP418].

US Office Action dated Jan. 30, 2014 issued in U.S. Appl. No. 13/313,422 [NOVLP419].

US Final Office Action dated May 13, 2014 issued in U.S. Appl. No. 13/313,422 [NOVLP419].

US Office Action dated Jul. 10, 2014 issued in U.S. Appl. No. 13/857,566 [NOVLP463].

US Office Action dated Feb. 5, 2014 issued in U.S. Appl. No. 13/478,999 [NOVLP476].

(56) References Cited

OTHER PUBLICATIONS

US Final Office Action dated Jul. 2, 2014 issued in U.S. Appl. No. 13/478,999 [NOVLP476].
Singapore Search and Examination Report dated Nov. 28, 2013, issued in SG 201102162-3 [NOVLP415SG].
Singapore Search and Examination Report dated Mar. 13, 2014, issued in SG 201301550-8 [NOVLP418SG].
PCT International Preliminary Report on Patentability and Written Opinion dated Aug. 28, 2014, issued in PCT/US2013/026069 [NOVLP418X1WO].
Bahari et al., (Jul./Aug. 2006) "Growth of a stacked silicon nitride/silicon oxide dielectric on Si (100)," *J. Vac. Sci. Technol.* B 24(4):2119-2123.
Kim et al (2013) "Double antireflection coating layer with silicon nitride and silicon oxide for crystalline silicon solar cell," *J. Electroceram*, 30:41-45.
Schultz et al., (2005) "Silicon Oxide/Silicon Nitride Stack System for 20% Efficient Silicon Solar Cells," *IEEE*, pp. 872-876.
Zohni et al., (2007) "Investigating thin film stresses in stacked silicon dioxide/silicon nitride structures and quantifying their effects on frequency response," *J. Micromech. Microeng.* 17:1042-1051.

* cited by examiner

Lowest Stress

Best NU%

TENSILE STRESSED DOPED AMORPHOUS SILICON

BACKGROUND

Various thin film layers for semiconductor devices may be deposited by chemical vapor deposition (CVD) and/or plasma-enhanced chemical vapor deposition (PECVD) processes. Some memory devices, such as NAND flash memory, are arranged in two-dimensional arrays. Because such memory devices are limited to a planar arrangement, die size and memory density parameters may constrain the total memory capacity of the device. In turn, moving to larger die sizes to expand memory capacity may comparatively increase the cost of the memory device, which may delay adoption of larger capacity memory devices. Certain approaches for arranging memory gates into three-dimensional (3D) arrays have been proposed. Some of these approaches incorporate transistors formed by patterning stacks of alternating film composition. FIG. 1 schematically shows an example film stack 1000 including alternating layers of first film 1020 and second film 1040 on a substrate 1060. These 3D arrays are sometimes utilized to form vertically integrated memory (VIM) structures.

Oftentimes, the unit layers used to form a VIM structure on a substrate have an as-deposited internal stress. In many cases the as-deposited internal stress is compressive. When many layers are positioned on top of one another, this internal stress may build up, thereby causing the coated substrate to bow instead of being flat. This bowing is undesirable because it can make subsequent processing more difficult. When the bow of a substrate exceeds a certain level, the substrate may be unusable.

In addition to internal stress, the roughness of a stack has an impact on the ability to conduct lithography reliably. If the surface of a stack is too rough, the incident radiation employed in photolithography will scatter too much. Also, the roughness of the stack is determined by the maximum roughness of any given layer in the stack. Therefore, it is important that each and every layer in the stack have a relatively low roughness.

SUMMARY

The disclosure concerns stacks of oxide and silicon layers such as those employed in vertically integrated memory stacks. Certain embodiments herein relate to methods and apparatus for reducing the bow in multilayer stacks fabricated on semiconductor substrates. The methods produce silicon layers having tensile, neutral, or low compressive internal stress. By comparison to other methods, the disclosed methods reduce the internal stress in one or more silicon layers of a work piece. A particularly beneficial application of the process is in reduction of internal stress in a stack containing two or more layers of dielectric material (e.g., silicon oxide) and two or more layers of doped silicon. Typically, though not necessarily, the internal stress of the dielectric layers is a compressive stress, which often manifests as wafer bow. The method and apparatus can be used to reduce compressive bow in stacks containing dielectric layers.

Some embodiments disclosed herein provide the benefit of improved smoothness of the layers and surface of multilayer stacks fabricated on semiconductor substrates, which improves the reliability of lithography on the substrate.

In some embodiments, each of the layers, whether an oxide layer or a silicon layer, is about 500 Å thick or less (e.g., about 250 to 350 Å thick). In some vertically integrated memory applications, the stacks contain at least about 50 layers of alternating dielectric and silicon (e.g., about 70 to 75 layers). In some embodiments, the overall thickness of the stack may be in the neighborhood of about 2 to 4 μm in height.

In one aspect of the embodiments herein, a method of preparing a stack structure for an electronic device on a semiconductor substrate is provided. The method includes (a) depositing a doped silicon layer on the substrate by introducing a first process gas comprising a silicon hydride and a dopant precursor into a chemical vapor deposition (CVD) apparatus having a plasma, (b) depositing a dielectric layer on the substrate by introducing a second process gas comprising a precursor of the dielectric layer into the CVD apparatus having a plasma; and (c) repeating operations (a) and (b) for two or more times to form a stack structure.

In some embodiments, the CVD apparatus is a plasma-enhanced chemical vapor deposition (PECVD) apparatus. In some embodiments, during deposition of a doped silicon layer according to (a) above, the substrate is held at a temperature of about 450° C. to 550° C., the silicon hydride in the first process gas is introduced at a flow rate of at least about 0.01 sccm/cm$^2$ of substrate deposition surface area, and the doped silicon layer has a compressive stress of less than about 100 MPa or a tensile stress, and a thickness of less than about 500 Å.

In some embodiments, during deposition of a dielectric layer according to (b) above, the dielectric layer has a compressive stress of at least about 200 MPa and a thickness of less than about 500 Å.

In some embodiments, the silicon hydride used in the process described above comprises silane. In some embodiments, the silicon hydride is introduced into the CVD apparatus at a flow rate of at least about 1200 sccm or greater for a 300 mm-diameter substrate, or at an equivalent flow rate scaled by substrate deposition surface area. In other embodiments, the silicon hydride is supplied at a flow rate of at least about 0.038 sccm/cm$^2$ of substrate deposition surface area.

In some embodiments, the first process gas comprises phosphine as the dopant precursor. In some embodiments, the first process gas further comprises helium, and the volume ratio of phosphine to helium is about 5:95.

In some embodiments, depositing the doped silicon layer in (a) is conducted at a pressure of between about 1 and 10 Torr. In some embodiments, the roughness of the doped silicon layer is about 5 Å or less as measured by atomic force microscopy. In some embodiments, the plasma is provided by powering a high frequency radio power source at about 500 watts or higher. In some embodiments, the bulk resistivity of the doped silicon layer after activation is less than about 0.001 ohm·centimeter.

In some embodiments, the stack structure manufactured by the method described above comprises amorphous or microcrystalline silicon, and the method further comprises activating the amorphous or microcrystalline silicon by heating, thereby converting the silicon to a polycrystalline state. In some embodiments, the stack structure has a total thickness of between about 1 and 6 micrometers. In some embodiments, the stack structure comprises at least 50 layers. In some embodiments, the stack structure is configured to be part of a vertically integrated memory device. In some embodiments, the stack structure comprises alternating layers of doped silicon and a dielectric material. In some embodiments, the stack structure comprises alternating layers of doped and undoped silicon.

In another aspect of the embodiments herein, a system is provided for preparing a stack structure for an electronic device on a semiconductor substrate. The system include a system controller and a multi-chamber apparatus comprising at least one vapor deposition (CVD) chamber having a plasma for depositing at least one layer of the stack over the semiconductor substrate. The system controller include instructions for depositing a doped silicon layer on the substrate by introducing a first process gas comprising a silicon hydride and a dopant precursor into a CVD apparatus, wherein the substrate is held at a temperature of about 450° C. to 550° C., the silicon hydride in the process gas is introduced at a flow rate of at least about 0.01 sccm/cm$^2$ of substrate deposition surface area, and the doped silicon layer has a compressive stress of less than about 100 MPa or a tensile stress, and a thickness of less than about 500 Å. The system controller also includes instructions for depositing a dielectric layer on the substrate by introducing a second process gas comprising a precursor of the dielectric layer into the CVD apparatus having a plasma, wherein the dielectric layer has a compressive stress of at least about 200 MPa and a thickness of less than about 500 Å.

In some embodiments, the multi-chamber apparatus of the system also includes a rapid thermal annealing chamber. In some embodiments, the controller also includes instructions for receiving the semiconductor substrate from outside the system and transferring the substrate from one chamber to another in the multi-chamber apparatus.

These and other features will be described below with reference to the associated drawings.

DETAILED DESCRIPTION

Figure 1:
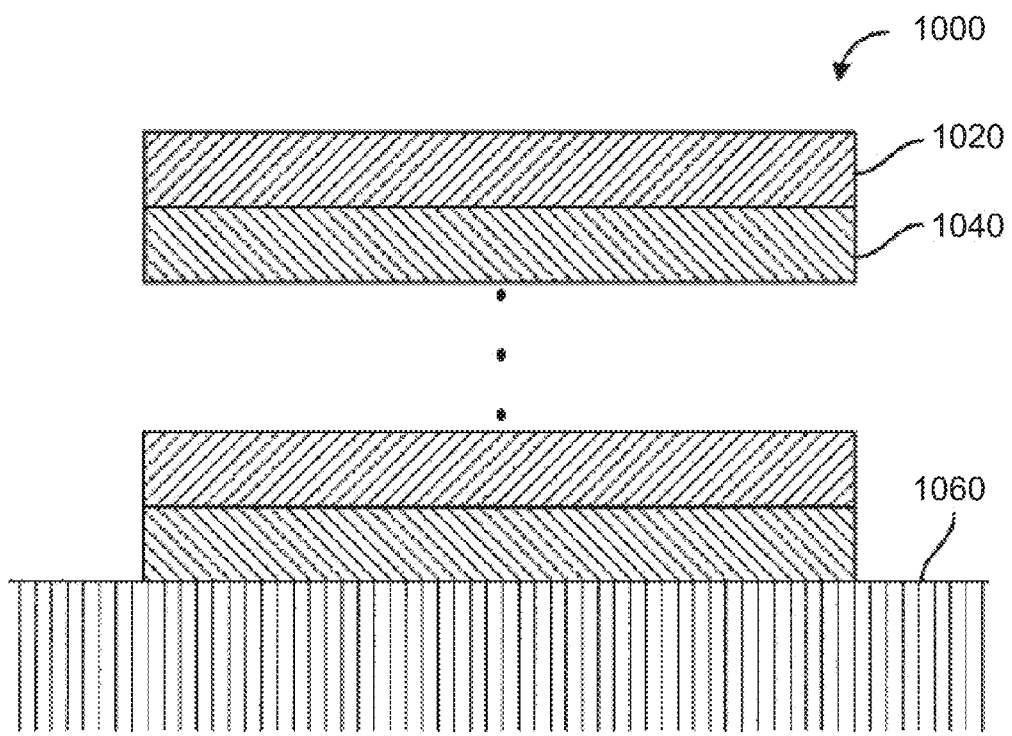
FIG. 1 shows an example film stack having alternating layers of material.

In this application, the terms "semiconductor wafer," "wafer," "substrate," "wafer substrate," and "partially fabricated integrated circuit" are used interchangeably. One of ordinary skill in the art would understand that the term "partially fabricated integrated circuit" can refer to a silicon wafer during any of many stages of integrated circuit fabrication thereon. Further, the terms "electrolyte," "plating bath," "bath," and "plating solution" are used interchangeably. The following detailed description assumes the invention is implemented on a wafer. However, the invention is not so limited. The work piece may be of various shapes, sizes, and materials. In addition to semiconductor wafers, other work pieces that may take advantage of this invention include various articles such as printed circuit boards and the like.

When silicon is discussed herein without qualification, it is intended that the silicon may have any morphological form, e.g., amorphous or polycrystalline silicon. Frequently, the as-deposited silicon does not initially possess a polycrystalline morphology. Rather its initial, as-deposited, morphology is amorphous or microcrystalline (i.e., a structure having small grains of crystalline Si within an amorphous phase). In the context of device fabrication, the as-deposited silicon is sometimes referred to as "unactivated." It may be subsequently "activated" to convert it into polycrystalline silicon or "polysilicon." Activation is typically accomplished by heating in a furnace or heating via a rapid thermal annealing (RTA) process. In many device fabrication schemes, unactivated silicon is subjected to some post-deposition processing before it is activated. Activation may reduce internal stress in silicon layers and stacks containing silicon layers.

In the following description, numerous specific details are set forth in order to provide a thorough understanding of the presented embodiments. The disclosed embodiments may be practiced without some or all of these specific details. In other instances, well-known process operations have not been described in detail to not unnecessarily obscure the disclosed embodiments. While the disclosed embodiments will be described in conjunction with the specific embodiments, it will be understood that it is not intended to limit the disclosed embodiments VIM structures, due to their 3D arrangement, allow for an increased total memory capacity per unit of die area as compared to 2D memory structures. VIM structures are typically formed from alternating layers of material. As used herein, the multilayer stacks include alternating layers of two or more materials, at least one of which includes silicon. In certain cases these materials may be doped and undoped silicon, or doped silicon and a dielectric material, or a combination of these materials. One non-limiting example of a dielectric material is an oxide such as silicon oxide. In some embodiments, a repeating unit of three different layers may be used in a stack. For example, in a particular embodiment, the stack comprises repeating layers of doped silicon, undoped silicon, and dielectric.

Oftentimes, the unit layers used to form a VIM structure on a substrate have an as-deposited internal stress. Wafer bow can be a problem for the stack and stress compensation is needed. In VIM and similar applications, stack bow and smoothness need to be managed. When depositing two alternating films back-to-back to build a stack structure for an electronic device on a semiconductor substrate, stacks containing more than 30, 60, or even 90 layers are deposited on a substrate, and are then patterned. The bow of the wafer cannot exceed an upper limit allowed by follow-on processing steps. In embodiments with a stack made up of oxide and amorphous silicon (a-Si) layers, the layers, or unit films, typically have compressive internal stress. The layers contribute to the overall compressive bow of the wafer as the number of layers increases and/or thickness of the layer(s) increase. The bow of the full stack is the sum of the combined thickness and layers of the unit film. Because both the films are very compressive as-deposited, the full stack structure will also have very compressive bow that is above the maximum limits for post wafer processing steps after the VIM stack structure is deposited.

In addition to a low value of stack bow, VIM stacks should have minimum surface roughness. This requires unit film with smooth surfaces and interfaces. The individual film layers have the largest impact on the stack structure's final surface roughness and planarization. Typically PECVD deposited film become rougher as thicknesses increase. Because the VIM 3D stacks are microns thick, the unit films making the layers need to be extremely smooth. In some implementations, VIM stacks with surface roughness of more than 10 to 15 Å will exceed the upper limits of the photo patterning follow-on process steps.

Furthermore, uniformity of deposited film layers is a desired property for layers in stacks for electronic devices, because non-uniformity in the layers leads to irregular surfaces, weakened structure, and deformation or lamination of the stack.

Some embodiments disclosed herein relate to processes involving high $SiH_4$ flow, which produce doped silicon films that have one or more of the following properties: natural or even tensile stress, smooth surfaces, uniform layers, and excellent sheet and bulk resistivity even at very thin film thickness upon RTA. The processes allow films to be deposited with a full range of adjustable stresses ranging from compressive to tensile. Because the processes provide tunable stress and the ability to make the film tensile, they can be used to tune the full stack bow and lower the compressive stress of the stack.

Typically, pairs of alternating layers of a VIM stack (e.g., a layer pair of doped silicon and dielectric, or a layer pair of undoped silicon and doped silicon) are provided as discrete pairs which may be interleaved with one another to the extent appropriate for the particular application under consideration. Thus, for example, a multilayer stack may primarily contain alternating layers of dielectric and doped silicon, with some inserted or interleaved pairs of layers of doped silicon and undoped silicon. In another example, the multilayer stack primarily contains pairs of undoped silicon and doped silicon, with one or more pairs of dielectric and doped silicon interleaved in the overall stack.

In some embodiments, the silicon layers in the stack are not sacrificial. In other words, they are preserved through the process. In a particular application, the silicon layer and the oxide layer are both retained in the final VIM stack product. The silicon layers may be used as gate electrodes, capacitor electrodes, etc.

In other embodiments, some silicon layers are sacrificial. That is, the silicon layers are removed by wet etching or other process prior to fabrication of the final product. The disclosure should not be limited to embodiments in which the silicon layers are non-sacrificial.

Typically, one or more or all of the silicon layers of the multilayer stack are deposited by a chemical vapor deposition process such as a plasma-enhanced chemical vapor deposition (PECVD) process. In some embodiments, all layers are deposited by PECVD.

In some embodiments, the dielectric layer contains silicon and oxygen. For example, the dielectric layer may be a silicon oxide layer. In one example, a PECVD film may be made by reaction of a silicon-containing precursor and a source of oxygen. Non-limiting examples include silane and tetra-ethylorthosilicate (TEOS) as silicon containing precursors, and molecular oxygen, $O_2$, and $N_2O$ as oxygen sources. Other chemical elements may be included to modulate a film's composition to enhance certain film properties. For example, elements such as carbon, hydrogen, or nitrogen may be introduced.

In some embodiments, the thickness of the individual layers is typically between about 10-1,000 Å, or between about 200-550 Å. These thicknesses are suitable for VIM and other applications. In such embodiments, the overall height of the complete multilayer stack may be between about 1-6 μm, or between about 1.5-4 μm. In certain cases, the layers are each of substantially similar thickness (e.g., within about 50%), and in some cases, the thickness of the individual layers is even more similar (e.g., within about 20%).

In VIM applications, the dielectric layers generally serve as insulating layers between the vertically stacked devices. In stacks employing the dielectric and doped silicon pairs, the doped silicon layers serve as gate electrodes. In stacks containing the undoped and doped silicon pairs, the undoped silicon layers serve as sacrificial layers which are subsequently etched and replaced with an oxide or other dielectric and the doped silicon layers, which remain after etch, serve as insulating layers.

In various embodiments disclosed herein, the silicon layers comprise doped silicon layers. That is, the silicon in the layer contains an incorporated dopant such as phosphorus, boron, or arsenic. In various embodiments described herein, phosphorus is typically identified as the dopant. Additionally, in the description of these embodiments, the dopant is frequently identified as phosphine, a phosphorus precursor gas. However, the disclosure should not be limited to phosphorus as the dopant or to phosphine as the dopant precursor for phosphorus.

As mentioned above, silicon, whether doped or undoped, is typically deposited in an amorphous or microcrystalline state and is only subsequently activated to assume its final polycrystalline state (sometimes referred to as polysilicon). In various applications, it is intended that the pre-activated state remains intact, without conversion to the polycrystalline state, during multiple steps following deposition. Therefore, it may be important in some applications (such as VIM applications) to not increase the temperature or otherwise apply thermal energy to a level that would activate the as-deposited silicon prior to patterning and etching.

In the application of preparing an integrated circuit, after a stack structure is prepared, an optional soft anneal process may be applied in some embodiments to reduce internal stress of the stack. Methods and apparatus including soft annealing are disclosed in U.S. patent application Ser. No. 13/857,566, files on Apr. 5, 2013, which is incorporated by reference in its entirety.

In the application of preparing an integrated circuit, after a stack structure is prepared, a patterning of the stack structure typically takes place after a hard mask (e.g., an ashable hard mask such as an amorphous carbon layer) is deposited over the stack. The mask may then be lithographically patterned. In certain cases, patterning is accomplished through a photolithographic process. In other cases, patterning is achieved through an electron beam lithography process. The resulting vertically etched stack structures will have dimensions appropriate for the particular application for which they will be used (e.g., VIM applications).

In certain embodiments, after patterning, the stack is etched to partially or fully remove one or more layers of the stack (e.g., sacrificial layers of undoped silicon) while substantially preserving the doped silicon. This selective etching may be primarily horizontal in direction and produces an undercut structure such as a fishbone structure. A wet etch may be employed to selectively remove (wholly or partially)

a layer or layers from the stack. Examples of wet etchants include hydrofluoric acid (including buffered versions of the acid), potassium hydroxide (KOH) and tetramethyl ammonium hydroxide (TMAOH). In vertical memory applications, a suitable dielectric, for example an oxide, may be deposited in the openings made by the removal of the undoped Si layers.

After patterning and optional etching, the amorphous or microcrystalline silicon is activated to convert it to its polycrystalline state. The polycrystalline state of doped silicon has significantly better electrical properties, most notably lower resistivity, than the pre-activation silicon.

Activation is typically accomplished by heating the amorphous or microcrystalline silicon to a controlled, elevated temperature for a controlled duration. In many cases activation occurs at a temperature of about 750° C. or higher. While lower temperatures may be used for the activation anneal, these lower temperatures typically require much longer times to complete the transition. This heating may be performed for a few seconds or longer, as necessary for the particular temperature and application. In some cases activation is accomplished using a laser crystallization process. Polysilicon often has an average grain size of about 10 nanometers to about 10 micrometers, although other grain sizes may be achieved.

A significant challenge encountered when depositing multilayer stacks (e.g., stacks containing many layers of doped and undoped silicon or layers of doped silicon and dielectric) is that these layers exhibit significant internal stress as-deposited. This internal stress causes the entire wafer to change shape through bowing. The bow of a wafer is measured as the difference in elevation between the center of the wafer and the perimeter of the wafer when the wafer is positioned horizontally. This bowing occurs at least in part because each of these three materials (dielectric and undoped/doped silicon) has a significant compressive internal stress. Because each layer in a stack contributes to the overall stress and bow of the wafer, stacks having more layers exhibit more stress and are more prone to bowing. Single layer films and stacks having only a few layers are much less likely to exhibit bowing problems. As a consequence, a wafer containing a stack of these materials deposited on a single side of the wafer will have a dome shape in which the stack is on the top or outer surface of the dome and the underlying substrate is on the bottom or inner surface of the dome. If the bow shift is sufficiently large in a given wafer, it can result in a number of problems. One of these problems is that it is difficult to use a conventional wafer processing apparatus, such as a wafer chuck, to conduct subsequent processing on a bowed wafer. A severely bowed wafer is very difficult to properly register to the extent required for photolithography, as this process requires precise optical focusing at precise locations on the substrate. When a wafer is bowed, the lithographic beam may try to focus on one part of the wafer but end up exposing a different part of the wafer due to the wafer's irregular shape. Further, the individual dies on the bowed wafer may not be properly processed in post stack deposition operations. For many applications, a wafer with a bow of greater than about 350 μm and more typically 150 μm or even 90 μm is not deemed suitable for processing.

A relatively low internal stress of the silicon layer is desirable. In some implementations, the silicon oxide layers produced as described herein have an internal stress of about 300 to 350 MPa compressive. Therefore, the silicon film ideally has an internal stress that offsets, at least partially, the high compressive stress of the oxide layers. In certain embodiments, the internal stress of the silicon layers is neutral to somewhat tensile to at least partially offset the intrinsic compressive stress of the oxide layers.

Hydrogen has been found to play a role in controlling internal stress in the film. It has been found that increasing the amount of hydrogen in a silicon film reduces its internal compressive stress. The amount of hydrogen present in a silicon film is a strong function of the mass flow rate of a silicon hydride precursor employed in the deposition process. Greater flow rates of silicon hydride during deposition produce silicon films with greater concentrations of hydrogen.

However, the amount of hydrogen can only be increased to a certain point. The activation process which converts the amorphous silicon and to polycrystalline silicon naturally dehydrogenates the amorphous silicon. If the amorphous silicon and contains too much hydrogen, the hydrogen gas leaving the film during the activation process will cause the film to blister or delaminated. Therefore, a careful balance is required to ensure that a sufficient amount of hydrogen is included in the film to reduce the compressive stress but the amount hundred and is limited to a level that is not cause delamination or blistering during the activation process.

It should also be noted that regardless of the amount of hydrogen in the film, the activation process naturally makes silicon and film more tensile, in other words, the internal compressive stress is reduced. However, certain lithography steps need to be performed prior to activation. Therefore, methods are desired to reduce the internal stress of the film prior to activation. In various embodiments disclosed herein, the internal stress of a stack containing silicon oxide layers and doped silicon layers is controlled prior to activation. In certain embodiments, it is controlled immediately prior to activation. This is because at this stage in certain fabrication process flows such as those employed to form vertically integrated memory (VIM), lithographic steps are employed prior to activation.

In addition to internal stress, the roughness of a stack has an impact on the ability to conduct lithography reliably. If the surface of a stack is too rough, the incident radiation employed in photolithography will scatter too much. Also, the roughness of the stack is determined by the maximum roughness of any given layer in the stack. Therefore, it is important that each and every layer in the stack have a relatively low roughness.

The methods and apparatus described herein provide the benefits of reduced bowing and roughness, thereby allowing manufacturers to meet stringent bow tolerances while maintaining extremely high quality multilayer stacks.

Methods

A challenge arises when forming stacks of alternating layers of oxide and silicon. For many applications including VIM applications, the oxide must be of very high quality. For example, it must have an appropriately low dielectric constant comparable to thermal oxide, a high breakdown voltage, and appropriate resistance to wet etching. Unfortunately, oxide meeting these requirements frequently has a relatively high internal stress. For oxide layers deposited at a thickness of about 150 to 250 Å, for example, the internal stress of a stack can be about 300 and 350 MPa compressive. This internal stress can accumulate layer-by-layer within the stack. If unchecked, the resulting wafer can have a significant bow, which can make it unsuitable for lithography and other process steps. For some applications, such as VIM applications, a wafer having a bow of about 90 μm or greater cannot be used.

Therefore, it becomes necessary to manage the internal stress in the layers of the stack. Unfortunately, the above-mentioned tight constraints on the electrical properties of the oxide do not afford significant latitude for reducing the internal stress in the deposit oxide layer. Compounding the problem, the silicon layer typically has an intrinsic compressive internal stress. Therefore the total compressive stress within the stack quickly grows to a level producing an unsuitable bow.

One aspect of the present disclosure provides methods for depositing silicon layers in the stack that contain relatively low compressive stress or even tensile stress, while meeting other requirements of the silicon layer such as low surface roughness and low resistivity.

The methods disclosed herein reduce the internal stress and/or roughness of one or more silicon layers of a work piece. Typically, though not necessarily, the internal stress is a compressive stress. A particularly beneficial application of the methods is in reduction of internal stress in a stack containing two or more layers of silicon. Often, the internal stress of a layer or group of layers in a stack is manifest as wafer bow, as described above. The methods can be used to reduce compressive bow in stacks containing silicon. Furthermore, in some embodiments, the methods may reduce the roughness of the surface of the work piece.

Some embodiments provide methods with the benefits of reduced internal stress (e.g., compressive stress) without activating the as-deposited amorphous or microcrystalline silicon. Therefore, the as-deposited stack has acceptable bow, which allows the required processing (e.g., patterning and selective etching) prior to activation to convert the as-deposited silicon in the stack to polysilicon.

Figure 2A:
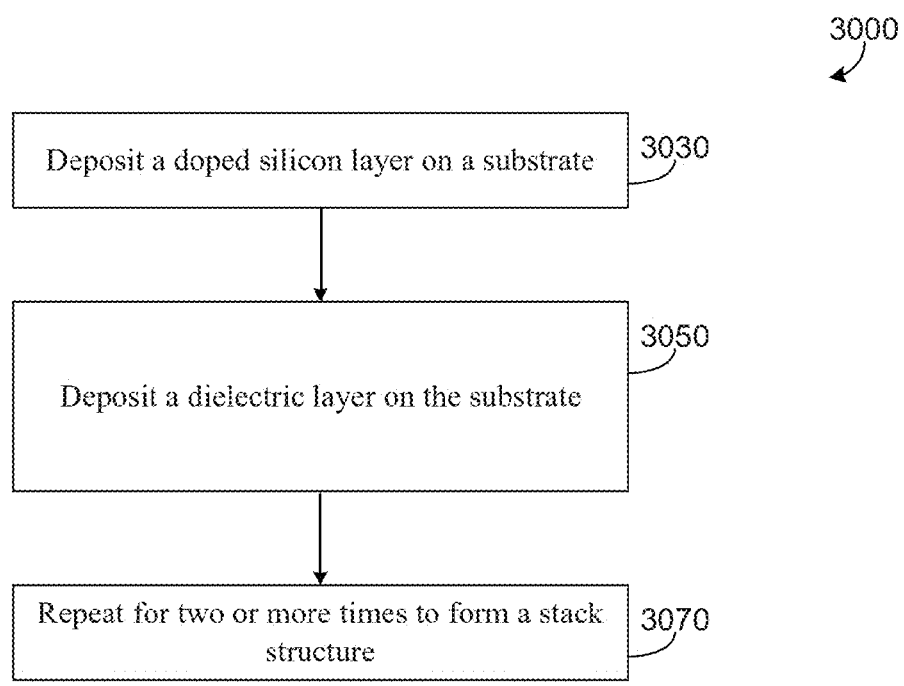
FIG. 2A shows a flowchart illustrating a method of processing a semiconductor substrate in accordance with an embodiment disclosed herein.
Figure 2B:
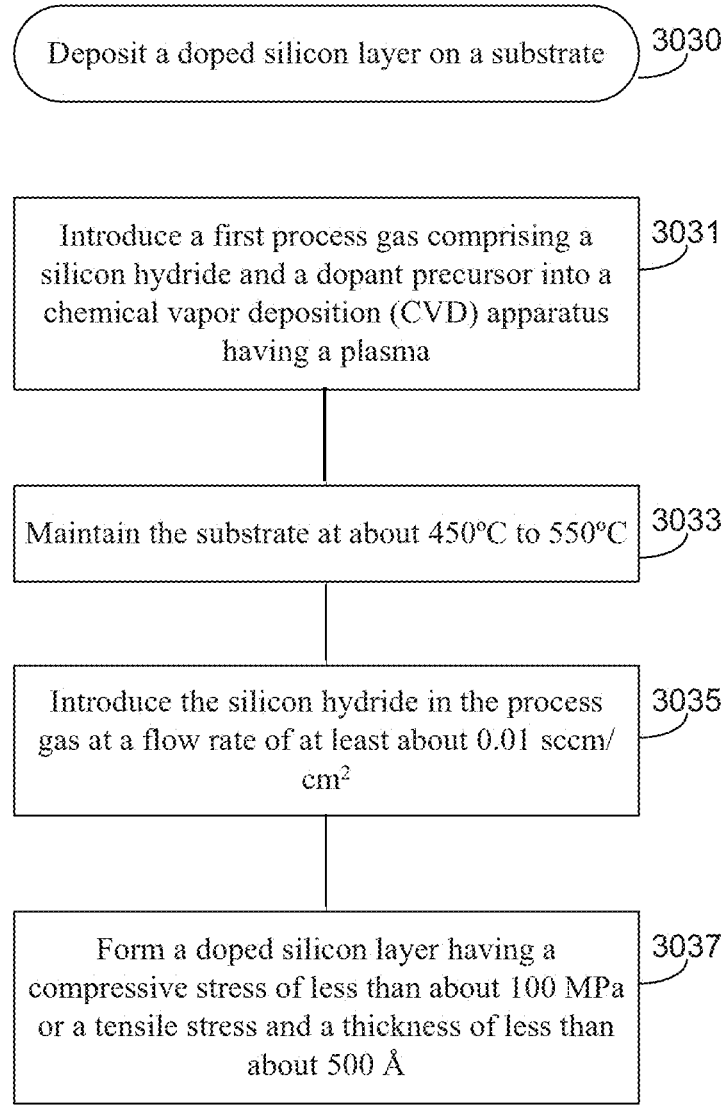
FIGS. 2B-2C show some of the relevant processing conditions for the embodiment.
Figure 2C:
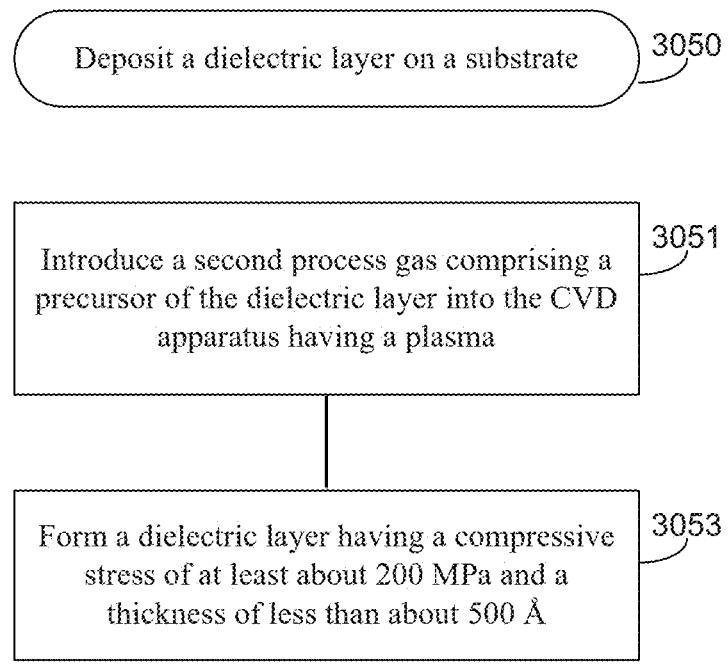

FIG. 2A shows a flowchart of an embodiment in accordance with the methods described herein; FIGS. 2B and 2C illustrate the processing conditions required in the process. The method 3000 for preparing a stack structure on a substrate involves depositing a doped silicon layer on a substrate, as indicated by block 3030. The method 3000 also involves depositing a dielectric layer on the substrate as indicated by block 3050. These steps are repeated for at least two times, thereby forming a stack structure over the substrate, see block 3070.

As described herein, the stack typically includes alternating layers of material. In one embodiment, the alternating layers include doped and undoped silicon. In another embodiment, the alternating layers include doped silicon and dielectric material. Other types of layers may also be used. In certain embodiments, each of the layers is deposited by a chemical vapor deposition process such as a plasma-enhanced chemical vapor deposition (PECVD) process.

As illustrated in FIG. 2B, depositing a doped silicon layer according to the method disclosed herein, as indicated by block 3030, requires a set of processing conditions shown in blocks 3031-3037. Typically, though not necessarily, these conditions are employed concurrently over the course of the silicon layer deposition process. The deposition of a doped silicon layer involves introducing a first process gas comprising a silicon hydride (e.g., silane) and a dopant precursor (e.g., phosphine) into a chemical vapor deposition (CVD) apparatus having a plasma, block 3031. The deposition of the doped silicon layer in this example requires the substrate to be held at a temperature of about 450° C. to 550° C. as indicated by block 3033. Furthermore, some embodiments require the silicon hydride in the first process gas to be introduced at flow rate of at least about 0.01 standard cubic centimeter per minute per square centimeter of depositing surface (sccm/cm$^2$), see block 3035. In some embodiments, the silicon hydride in the first process gas is introduced at flow rate of at least about 0.017 sccm/cm$^2$, or at least about 0.038 sccm/cm$^2$. In some embodiments, the silicon hydride is introduced at a flow rate of least about 1200 sccm or greater for a 300 mm-diameter substrate, or at an equivalent flow rate scaled by substrate deposition surface area. The deposition method disclosed above forms a doped silicon layer having a compressive stress of less than about 100 MPa or a tensile stress and a thickness of less than about 500 Å, see block 3037.

In some embodiments, as illustrated in FIG. 2C, depositing a dielectric layer on a substrate, as indicated by block 3050, requires a set of processing conditions shown in blocks 3051-3053. The deposition of a doped silicon layer involves introducing a second process gas comprising a precursor of the dielectric layer into a CVD apparatus having a plasma, block 3051, thereby forming a dielectric layer having a compressive stress of at least about 200 MPa and a thickness of less than about 500 Å, as shown in block 3053.

According to the example disclosed in FIG. 2A, a stack structure is formed by repeating the steps of blocks 3030 and 3050, see block 3070. In some embodiments not shown in the figure, a soft anneal process is performed after the stack structure is formed, which is achieved by providing a stack-coated substrate in an anneal chamber and subjecting the substrate to an elevated temperature for a particular duration. In many implementations, the soft anneal temperature should be below the temperature at which silicon transitions to polysilicon. This is especially important where the soft anneal process takes place before the etching operation, as the etching operation is most successful (i.e., etch selectivity is greatest between the two materials) when performed on unactivated silicon.

In some applications of the methods described above, the stack structure is used to prepare an integrated circuit. In some applications, after the stack structure is formed, a hard mask is deposited on the stack. The mask may be an ashable hard mask in certain embodiments. The hard mask is then patterned. This patterning may be achieved through photolithographic techniques. The patterned stack is then etched to selectively remove (partially or wholly) one of the materials in the stack. A wet etch is often used for this purpose. The as-deposited silicon may then be activated to form polysilicon in layers of the integrated circuit.

The stack may have a composition and arrangement as described above (i.e., it may include layers of doped polysilicon with alternating layers of one or more other materials). In some embodiments, those other materials are a dielectric (e.g., a silicon oxide or a variant thereof such as an oxicarbide or an oxinitride), undoped silicon, and the like. In some cases, the alternating layers are deposited in a single vacuum controlled apparatus with multiple stations or variable process conditions to effect deposition of the layers of different compositions. In certain embodiments, the layers of the stack are deposited by a PECVD process.

Example Properties of the Stack Structure

In some embodiments, the stack structure produced by the methods disclosed herein has properties desirable for applications in integrated circuits.

Thickness.

In some embodiments, each layer of doped silicon deposited in the stack is about 250 to 350 Å in thickness. The total stack height, including all oxide and silicon layers is about to 2-4 µm in height.

Resistivity.

The conductivity of the deposited silicon layers should be as high as possible. Stated another way, the resistivity or sheet resistance should be as low as possible. The resistivity of the silicon layers is most appropriately measured after activation. Activation converts the as deposited amorphous silicon and the polysilicon. The polysilicon is present in the final product, and therefore its electrical properties are relevant. After activation, the bulk resistivity of the polysilicon may be at most about 0.001 ohm-centimeter or more specifically at most about 0.0085 ohm·centimeter in some embodiments. For a polysilicon film having a thickness of about 250 to 350 Å, the sheet resistance should be below about 300 ohms per square in some embodiments. The resistivity of the silicon layer is a strong function of the dopant concentration.

Roughness.

In certain embodiments, the as deposited and activated silicon layer may be characterized as "ultra-smooth." In certain embodiments, the roughness of the silicon layer is about 5 Å or less as measured by atomic force microscopy. In certain embodiments, the roughness of the silicon layer is about 3 Å or less as measured by atomic force microscopy. The roughness of a single layer in a stack propagates throughout stack so that the roughness of the entire is dictated by the roughness of the roughest layer in the stack. As indicated, the activation process crystallizes the film; that is activation converts the amorphous silicon matrix to silicon crystallites. Typically, these crystallites have a side-to-side dimension of about 85 to 125 Å. This size suggests that the activated film may have a roughness considerably greater than the 5 Å cutoff mentioned below. However, it has been found that when depositing silicon using the deposition conditions described herein, the activated polysilicon film has a roughness that is no greater than approximately the roughness of the as-deposited amorphous silicon film. Without wishing to be bound by a particular theory or mechanism, it is believed that under appropriate deposition conditions, the as-deposited amorphous silicon is not only smooth but contains nucleation sites that promote crystal growth in a sidewise or horizontal direction with little or no upward or vertical growth that would increase the roughness of the as-deposited film.

Internal Stress.

In some embodiments, a doped silicon layer of a stack deposited using the methods described herein has a compressive stress of less than about 100 MPa or even a tensile stress. In certain embodiments, the internal stress of the silicon layer is about neutral (i.e., neither tensile nor compressive) to about 100 MPa tensile. In certain embodiments, the internal stress of the silicon layer is between about neutral and 50 MPa tensile. If left unmitigated, the oxide layers in the stack of 70 to 75 layers will produce a poem about 135 μm. One embodiment of the disclosed process employs silane as the silicon hydride of the process gas, and phosphine as the dopant precursor in the process gas. This embodiment involves a method for manufacturing 300 mm wafers in a four showerhead four wafer station reaction chamber. It employs a silane flow rate of 1450 sccm, a phosphine flow rate of 725 sccm (phosphine is provided as a 5% composition and 95% helium), pressure of 6 Torr, temperature of 500° C., an RF power of 870 W (at 13.57 MHz), and the carrier gas flow rate of 15,000 sccm (helium).

Parameters for Silicon Layer Deposition

To achieve desirable properties of the stack structure disclosed above, relevant parameters are required for the deposition of silicon layers. The relevant parameters include but are not limited to flow rate of a silicon and hydride process gas, the temperature of the substrate, the power delivered by the plasma source, and the chamber pressure.

Process Gas.

The principal process gas should contain silicon. It typically also includes hydrogen. While silane is identified as the precursor gas in most examples disclosed herein, other silicon hydride process gases may be used. These include di-silane, tri-silane, and various substituted silanes, di-silanes, and tri-silanes. In the substituted compounds, one or more of the hydrogen atoms in the base silane, di-silane, or tri-silane is replaced by a hydrocarbon moiety or other substituent. One of the roles of the silicon and hydride precursor is to provide hydrogen atoms in the as-deposited silicon and film.

The mass flow rate of the silane delivered to the reactor is relatively high by conventional silicon deposition standards. In various embodiments, the flow rate of the silane process gas is at least about 1200 sccm in a four station PECVD reactor such as the Vector family of PECVD reactors available from Lam Research Corporation of Fremont Calif.

Figure 10A:
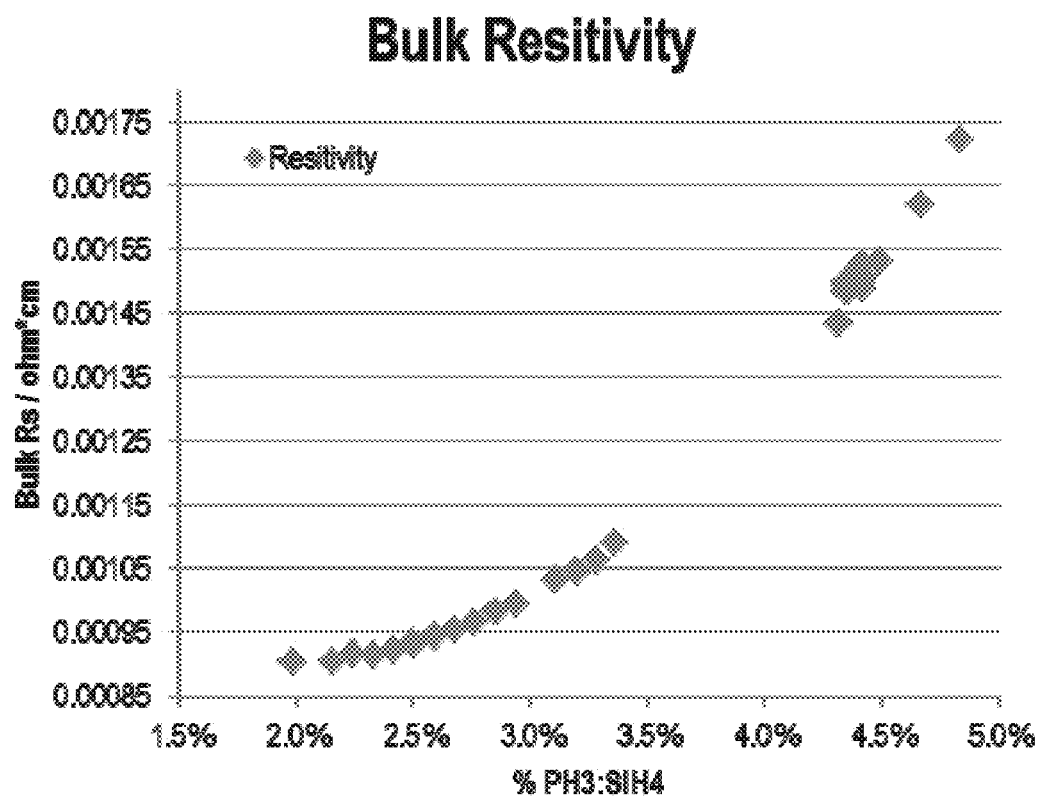
FIGS. 10A and 10B show the impact of phosphine to silane flow rate ratio on the bulk resistivity and sheet resistance of the deposited silicon films after activation.
Figure 10B:
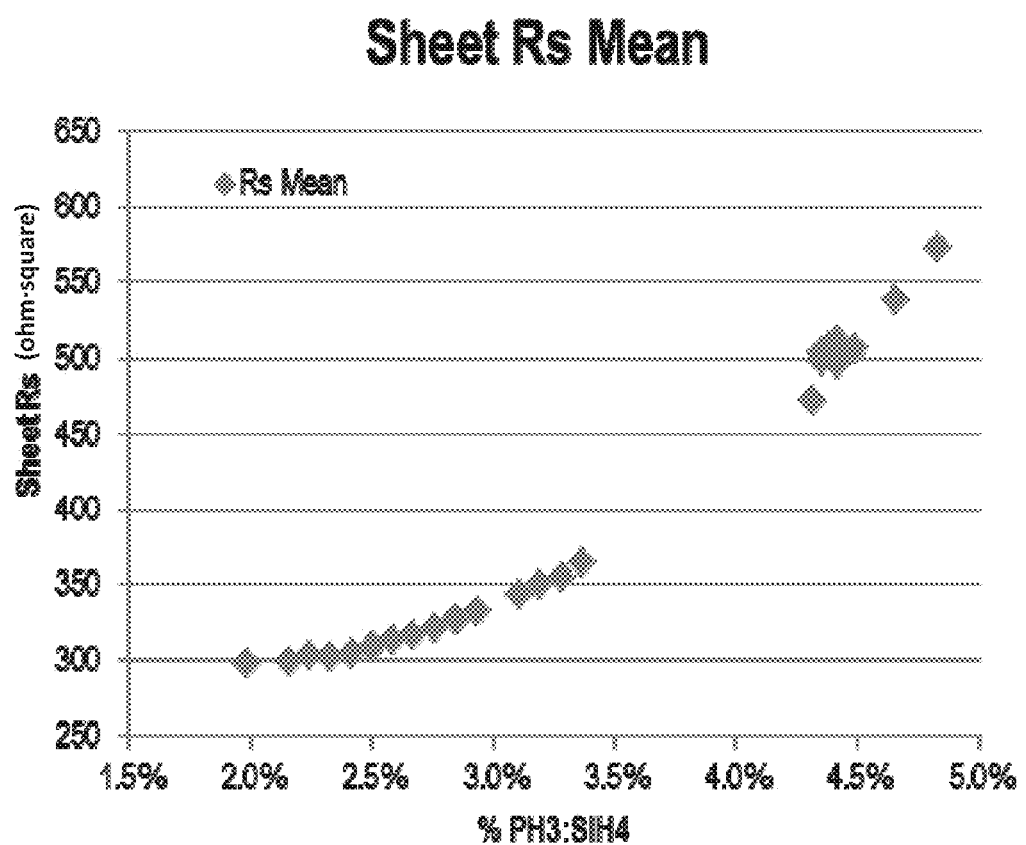

In some embodiments, the dopant precursor gas is delivered in conjunction with the silane. For example, phosphine may be provided along with the silane process gas. In one example where phosphine is used as the dopant precursor, phosphine is provided at a flow rate of about 600 to 1000 sccm. In this example, phosphine is provided in a gas mixture 5% phosphine by volume in helium process gas. In some cases, the amount of phosphine (provided as the 5% composition) is between about 650 and 850 sccm (e.g., about 725 sccm). Of course, phosphine or other dopant precursor can be used in other concentrations, in which case the listed flow rates should be adjusted to provide equivalent amounts of the dopant precursor. In various embodiments, the phosphine or other dopant precursor is provided with silane in a particular ratio of dopant precursor with respect to the silane process gas. FIGS. 10A-10B show the effect of varying the phosphine-silane ratio on the resistivity of the deposited silicon and film, which figures are further discussed below.

Typically, a carrier gas is used to deliver the silane and dopant precursor to the reaction chamber. In various embodiments, the carrier gas is a noble gas such as argon or helium. In certain embodiments, where helium is employed, the helium provided at a flow rate of about 10,000 to 20,000 sccm for a four station PECVD reactor such as any of the Vector family of reactors available from Lam Research Corporation. In specific embodiments, the flow rate of helium is between about 13,000 and 17,000 sccm (e.g., about 15,000 sccm).

Pressure.

In certain embodiments, the pressure in the reactor is between about 4 and 7 Torr; or between 1 and 10 Torr, e.g., about 6 Torr.

Power.

In certain embodiments, the power delivered to a plasma generator is between about 500 and 1000 W or between about 750 and 950 W (e.g., about 870 W) for an inductively coupled plasma source for a four station reactor such as a Vector PECVD reactor available from Lam Research Corporation. In some embodiments, the RF power should be applied at the frequency of 13.57 MHz. Other sources of plasma such as capacitively coupled plasma generator may be employed.

Temperature.

In certain embodiments, the substrate temperature during the silicon deposition process is between about 400 and 600° C. In some cases, the substrate temperature is between about 450 and 575° C. In some examples, the temperature of the substrate is between about 475 and 525° C. (e.g., about 500° C.). Typically, though not necessarily, temperature of the substrate is maintained by applying heating and/or cooling through a pedestal or chuck on which the wafer is held during the silicon deposition process.

Some parameters such as those for the plasma power and the flow rates of process gases are presented in values appropriate for use in a four station deposition chamber such as one of the Vector PECVD reactors available from Lam Research Corporation. It should be noted, that these parameters assume that the substrates processed in such chambers are 300 mm wafers. The values set forth herein for the power and process gas flow rates can be scaled to other reactors that use other substrate sizes or by multiplying the parameter value by a ratio of the surface areas of the wafer under consideration to that of the 300 mm wafer. For example, if a four station reactor having a volume and dimensions similar to that of Lam Research Vector system, but instead uses wafer pedestals for 450 mm wafers, the above process parameters may be scaled by the surface area of a 450 mm wafer divided by the surface area of a 300 mm wafer, or a factor of 2.25.

The reduction in wafer bow as described herein can be achieved without delaminating, peeling or blistering. Blistering is often evidenced by small bubbles or divots where material popped out of the stack. Peeling involves separation between layers at an intermediate position in the stack, i.e., between two different layers of the stack. Delamination results when the entire stack separates from the substrate.

Apparatus

The methods described herein may be performed by any suitable apparatus. A suitable apparatus includes hardware for accomplishing the process operations and a system controller having instructions for controlling process operations in accordance with the present embodiments.

Some embodiments relate to a system for preparing a stack structure for an electronic device on a semiconductor substrate. In some embodiments, the system includes a multichamber apparatus comprising at least one PECVD chamber for depositing at least one layer of the stack over the semiconductor substrate. The system also includes a controller comprising instructions for depositing a doped silicon layer on the substrate by introducing a first process gas comprising a silicon hydride and a dopant precursor into a chemical vapor deposition (CVD) apparatus having a plasma. In some embodiments, the substrate is held at a temperature of about 450° C. to 550° C. In some embodiments, the silicon hydride in the process gas is introduced at a flow rate of at least about 0.01 sccm/cm$^2$ of substrate deposition surface area. In some embodiments, the silicon hydride is introduced at a flow rate of at least about 0.038 sccm/cm$^2$. In some embodiments, the doped silicon layer has a compressive stress of less than about 100 MPa or a tensile stress, and a thickness of less than about 500 Å. The controller also comprises instructions for depositing a dielectric layer on the substrate by introducing a second process gas comprising a precursor of the dielectric layer into the CVD apparatus having a plasma. In some embodiments, the dielectric layer has a compressive stress of at least about 200 MPa and a thickness of less than about 500 Å.

In some embodiments, the multi-chamber apparatus also includes a rapid thermal annealing (RTA) chamber. In some embodiments, the RTA chamber is a soft anneal chamber integrated with an apparatus for depositing a stack containing layers of doped silicon and layers of at least one other material such as silicon oxide (or other dielectric) or undoped silicon. Such deposition apparatus may include hardware for accomplishing the deposition operations and its own system controller having instructions for controlling deposition operations. In some embodiments, the deposition apparatus is a PECVD apparatus.

Figure 3:
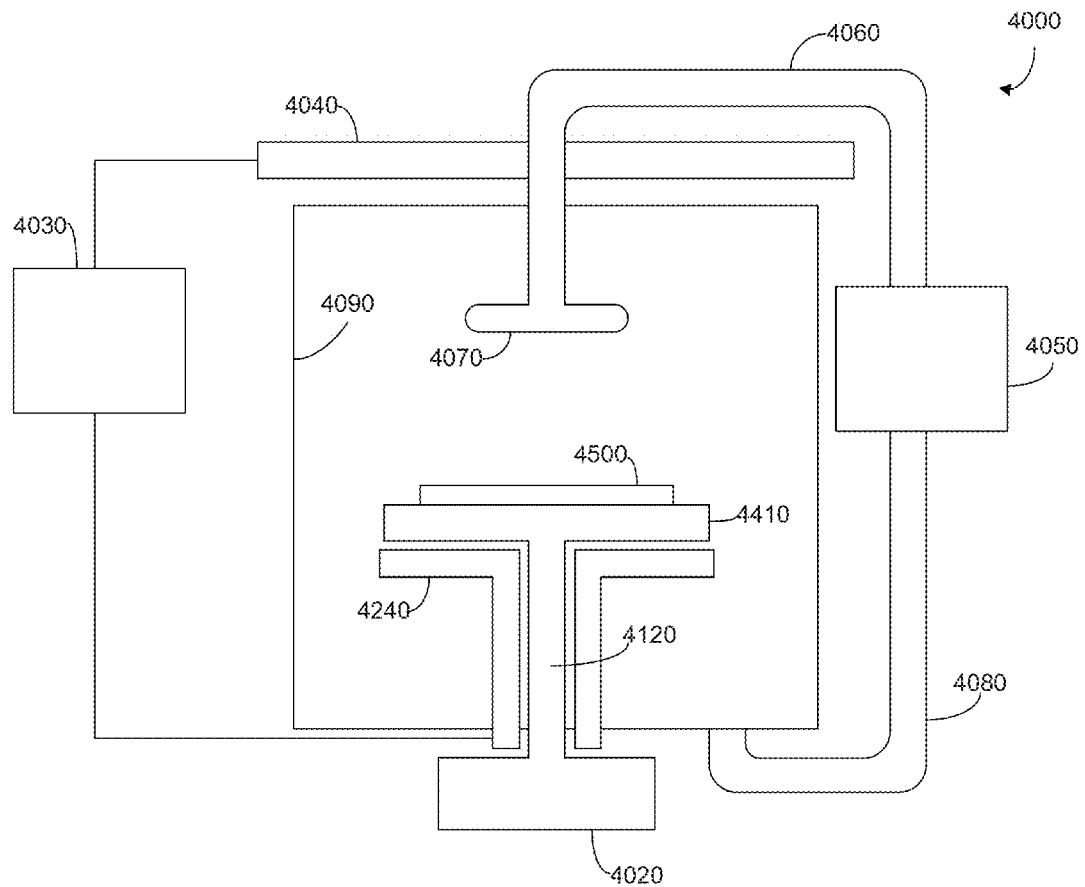
FIG. 3 shows an example of an annealing chamber that may be used in accordance with the embodiments herein.

The FIG. 3 shows a simplified depiction of a suitable activation chamber 4000 in accordance with an embodiment disclosed herein. Wafer 4500 is mounted on a susceptor 4410 supported by susceptor support 4120. A susceptor position control 4020 may rotate the wafer 4500 during processing, and may also raise and lower susceptor 4410 to certain positions in order to load, unload or process a wafer 4500. Heat control mechanism 4030 controls heat sources 4040 and 4240, which heats the wafer 4500 to a substantially uniform temperature during processing. Gas flow control 4050 regulates the flow of gases into the reaction chamber 4090 of the anneal chamber 4000. This control may be achieved by controlling the flow of gas in inlet channel 4060 and gas injection head 4070, as well as exhaust gases from the reaction chamber 4090 through outlet channel 4080. In another embodiment of the activation chamber (not shown), gases are introduced into the reaction chamber through a plurality of side jets. In yet other embodiments of the activation apparatus, the reaction chamber may be shaped in a non-rectangular fashion (e.g., bell shaped, rounded, etc.). Any chamber shape may be used.

Activation can be conducted in any vehicle that permits delivery of energy to the silicon layers under conditions allowing adequate temperature control. One example of such a vehicle is a furnace that includes conventional heating elements such as resistive heating elements. In some embodiments, the anneal is conducted in a chamber that employs radiation from one or more lamps or laser sources to provide annealing energy. Rapid thermal annealing (RTA) chambers are a widely used type of lamp source annealing chamber that can be used to perform activation. One example of a suitable RTA tool is the Applied Materials Vantage Radiance Plus RTP. In some examples, the RTA tool has multiple bulbs, all positioned above the wafer. The temperature is monitored near the wafer bottom to ensure that the entire wafer (not just the wafer surface) is adequately heated through. This is opposed to a laser anneal, which locally heats the surface of the wafer. In some embodiments, the wafer rotates on a platen during RTA. RTA tools and methods are further discussed and described in U.S. Pat. No. 6,151,447, filed on Nov. 25, 1997, which is incorporated by reference herein in its entirety.

Figure 4:
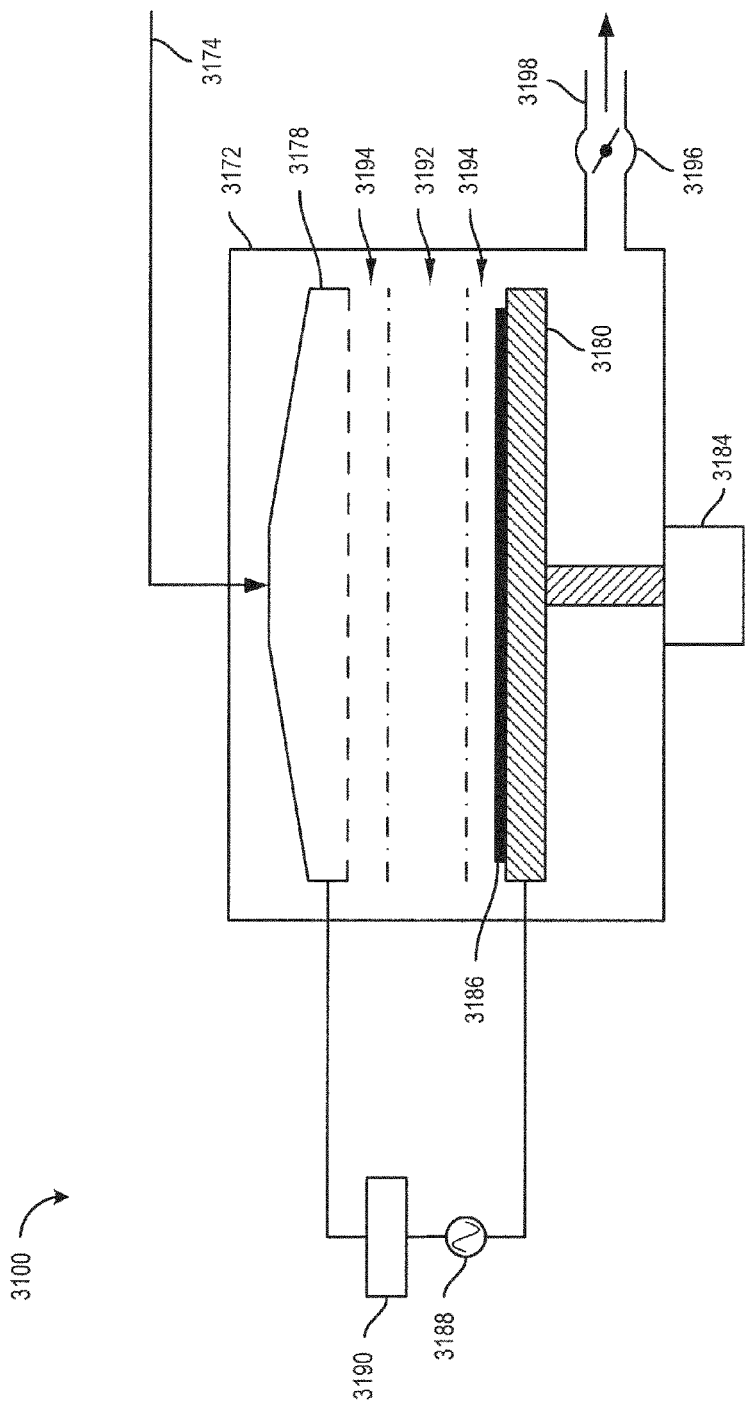
FIG. 4 depicts an example of a PECVD deposition processing station that may be used in accordance with an embodiment herein.

FIG. 4 schematically shows a deposition process station 3100 in accordance with the embodiments herein. For simplicity, process station 3100 is depicted as a standalone process station having a process chamber body 3172 for maintaining a low-pressure environment. However, it will be appreciated that a plurality of process stations 3100 may be included in a common low-pressure process tool environment. Process station 3100 includes a process gas delivery line 3174 for providing process gases, such as inert gases, precursors, reactants, and treatment reactants, for delivery to process station 3100. In the example shown in FIG. 4, a showerhead 3178 is included to distribute process gases within process station 3100. Substrate 3186 is located beneath showerhead 3178, and is shown resting on a holder 3180 supported by a pedestal 3182. In some embodiments, pedestal 3182 may be configured to rotate about a vertical axis. Additionally or alternatively, pedestal 3182 may be configured to translate horizontally and/or vertically.

In some embodiments, showerhead 3178 may be a dual-plenum or multi-plenum showerhead having a plurality of sets of gas distribution holes. For example, a first set of gas distribution holes may receive gas from a first process gas delivery line and a second set of gas distribution holes may receive gas from a second process gas delivery line, etc. Such physical isolation of process gases may provide an approach to reducing the amount of small particles generated from reaction of incompatible process gases in process gas delivery plumbing upstream of showerhead 3178.

Showerhead 3178 and holder 3180 electrically communicate with RF power supply 3188 and matching network 3190 for powering a plasma 3192. Plasma 3192 may be contained by a plasma sheath 3194 located adjacent to showerhead 3178 and holder 3180. While FIG. 4 depicts a capacitively-coupled plasma, plasma 3192 may be generated by any suitable plasma source. In one non-limiting example, plasma 3192 may include a parallel plate plasma source.

In the embodiment shown in FIG. 4, RF power supply 3188 may provide RF power of any suitable frequency. In some embodiments, RF power supply 3188 may be configured to control high- and low-frequency RF power sources independently of one another. Example low-frequency RF powers may include, but are not limited to, frequencies between 200 kHz and 2000 kHz. Example high frequency RF powers may include, but are not limited to, frequencies between 13.56 MHz and 80 MHz. Likewise, RF power supply 3188 and matching network 3190 may be operated at any suitable power to form plasma 3192. Examples of suitable powers include, but are not limited to, powers between 250 W and 5000 W for a high-frequency plasma (assuming a four station reaction chamber) and powers between 0 W and 2500 W (assuming a four station reaction chamber) for a low-frequency plasma for a four-station multi-process tool including four 15-inch showerheads. RF power supply 3188 may be operated at any suitable duty cycle. Examples of suitable duty cycles include, but are not limited to, duty cycles of between 5% and 90%.

In some embodiments, holder 3180 may be temperature controlled via heater 3184. Further, in some embodiments, pressure control for process station 3100 may be provided by butterfly valve 3196 or by any other suitable pressure control device. As shown in FIG. 4, butterfly valve 3196 throttles a vacuum provided by a vacuum pump (not shown) fluidly coupled to process station exhaust line 3198. However, in some embodiments, pressure control of process station 3100 may also be adjusted by varying a flow rate of one or more gases introduced to process station 3100.

It will be appreciated that control of one or more process parameters may be provided locally (e.g., RF power may be controlled by a plasma controller communicating with RF power supply 3188, process station pressure may be controlled by a valve controller communicating with butterfly valve 3196 or with gas metering valves or flow controllers included coupled with process gas delivery line 3174, etc.) or under partial or total control provided by a system controller (described in more detail below) communicating with process station 3100 without departing from the scope of the present disclosure.

As described above, one or more process stations may be included in a multi-station processing tool. In some embodiments of a multi-station process tool, control and/or supply of various process inputs (e.g., process gases, plasma power, heater power, etc.) may be distributed from shared sources to a plurality of process stations included in the process tool. For example, in some embodiments, a shared plasma generator may supply plasma power to two or more process stations. In another example, a shared gas distribution manifold may supply process gases to two or more process stations.

Figure 5:
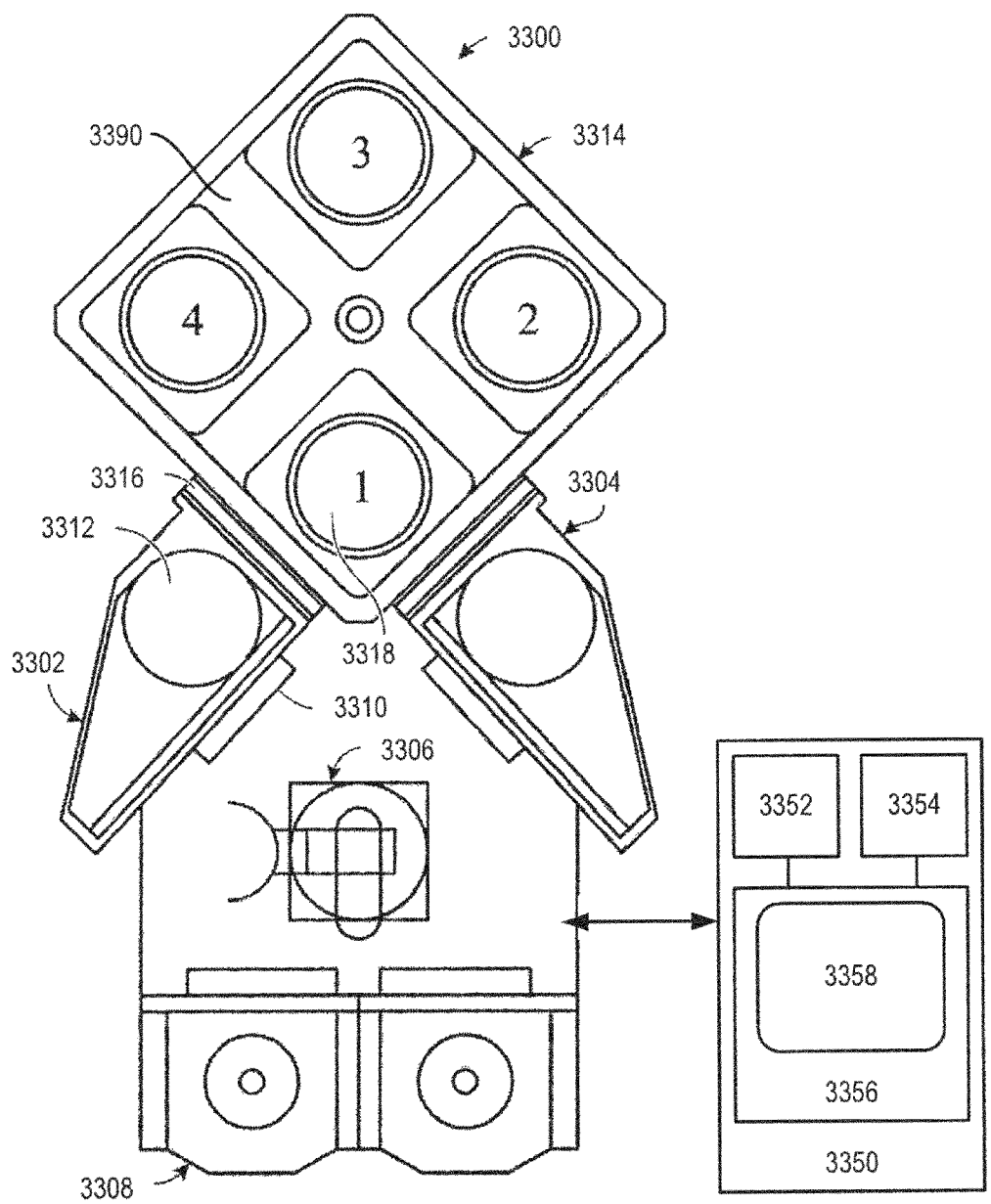
FIGS. 5-6 show multi-station semiconductor processing apparatuses in accordance with the embodiments herein.

FIG. 5 shows a schematic view of an embodiment of another multi-station processing tool 3300 with an inbound load lock 3302 and an outbound load lock 3304. A robot 3306, at atmospheric pressure, is configured to move substrates from a cassette loaded through a pod 3308 into inbound load lock 3302 via an atmospheric port 3310. Inbound load lock 3302 is coupled to a vacuum source (not shown) so that, when atmospheric port 3310 is closed, inbound load lock 3302 may be pumped down. Inbound load lock 3302 also includes a chamber transport port 3316 interfaced with processing chamber 3314. Thus, when chamber transport 3316 is opened, another robot (not shown) may move the substrate from inbound load lock 3302 to a pedestal of a first process station for processing.

In some embodiments, inbound load lock 3302 may be connected to a remote plasma source (not shown) configured to supply a plasma to load lock. This may provide remote plasma treatments to a substrate positioned in inbound load lock 3302. Additionally or alternatively, in some embodiments, inbound load lock 3302 may include a heater (not shown) configured to heat a substrate. This may remove moisture and gases adsorbed on a substrate positioned in inbound load lock 3302. While the embodiment depicted in FIG. 5 includes load locks, it will be appreciated that, in some embodiments, direct entry of a substrate into a process station may be provided.

The depicted processing chamber 3314 comprises four process stations, numbered from 1 to 4 in the embodiment shown in FIG. 5. In some embodiments, processing chamber 3314 may be configured to maintain a low pressure environment so that substrates may be transferred among the process stations without experiencing a vacuum break and/or air exposure. Each process station depicted in FIG. 5 includes a process station substrate holder (shown at 3318 for station 1) and process gas delivery line inlets. In some embodiments, one or more process station substrate holders 3318 may be heated.

In some embodiments, each process station may have different or multiple purposes. For example, a process station may be switchable between a soft anneal mode and a conventional anneal mode. Additionally or alternatively, in some embodiments, processing chamber 3314 may include one or more matched pairs of soft and conventional annealing stations. In another example, a process station may be switchable between two or more film types, so that stacks of different film types may be deposited in the same process chamber.

While the depicted processing chamber 3314 comprises four stations, it will be understood that a processing chamber according to the present disclosure may have any suitable number of stations. For example, in some embodiments, a processing chamber may have five or more stations, while in other embodiments a processing chamber may have three or fewer stations.

FIG. 5 also depicts an embodiment of a substrate handling system 3390 for transferring substrates within processing chamber 3314. In some embodiments, substrate handling system 3390 may be configured to transfer substrates between various process stations and/or between a process station and a load lock. It will be appreciated that any suitable substrate handling system may be employed. Non-limiting examples include substrate carousels and substrate handling robots.

Figure 6:
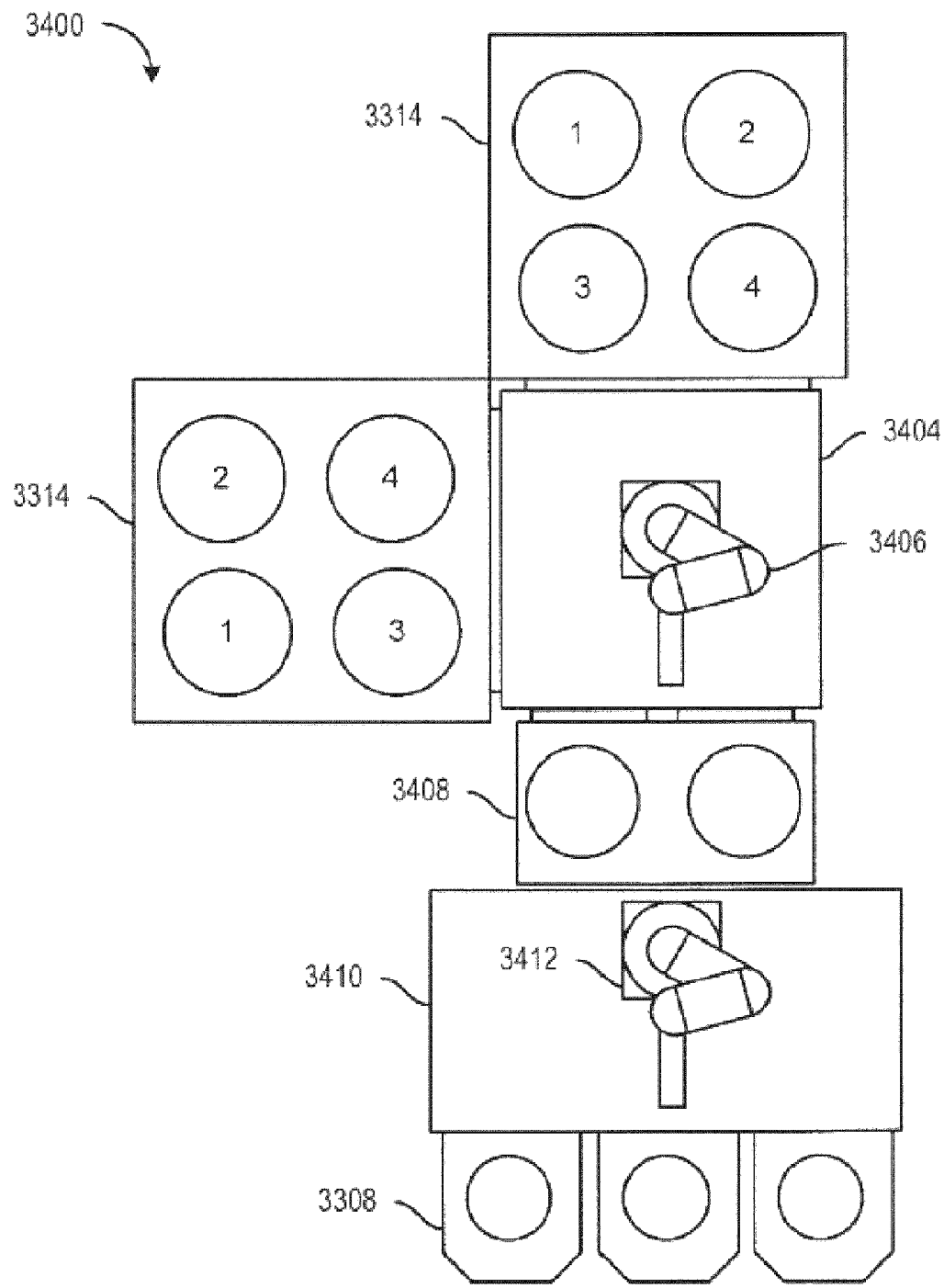

In some embodiments, a low-pressure transfer chamber may be included in a multi-station processing tool to facilitate transfer between a plurality of processing chambers. For example, FIG. 6 schematically shows another embodiment of a multi-station processing tool 3400. In the embodiment shown in FIG. 6, multi-station processing tool 3400 includes a plurality of processing chambers 3314 including a plurality of process stations (numbered 1 through 4). Processing chambers 3314 are interfaced with a low-pressure transport chamber 3404 including a robot 3406 configured to transport substrates between processing chambers 3314 and load lock 3408. An atmospheric substrate transfer module 3410, including an atmospheric robot 3412, is configured to facilitate transfer of substrates between load lock 3408 and pod 3308.

System Controller

Turning back to FIG. 5, multi-station processing tool 3300 also includes an embodiment of a system controller 3350 employed to control process conditions and hardware states of processing tool 3300. For example, in some embodiments, system controller 3350 may control one or more process parameters during a PECVD film deposition phase to achieve a desired internal stress of the deposited film. While not shown in FIG. 6, it will be appreciated that the embodiment of multi-station processing tool 3400 may include a suitable system controller like the embodiment of system controller 3350 shown in FIG. 5.

In some embodiments, a system controller 3350 (which may include one or more physical or logical controllers) controls some or all of the operations of a process tool. Instructions for implementing appropriate control operations are executed on the processor. These instructions may be stored on the memory devices associated with the controller or they may be provided over a network. In certain embodiments, the system controller executes system control software.

For example, a controller may control the delivery of appropriate gases (e.g., nitrogen or inert gases), the receipt of a wafer from outside the apparatus and/or the transfer a wafer from one station to the next of a multi-station chamber. The controller may also control the temperature profile, RF power, etc. during deposition.

System controller 3350 may include one or more memory devices 3356, one or more mass storage devices 3354, and one or more processors 3352. Processor 3352 may include a CPU or computer, analog and/or digital input/output connections, stepper motor controller boards, etc.

In some embodiments, system controller 3350 controls all of the activities of processing tool 3300. In some embodiments, system controller 3350 executes machine-readable system control software 3358 stored in mass storage device 3354, loaded into memory device 3356, and executed on processor 3352 so that the apparatus will perform a method in accordance with the present embodiments. Alternatively, the control logic may be hard coded in the controller. Applications Specific Integrated Circuits, Programmable Logic Devices (e.g., field-programmable gate arrays, or FPGAs) and the like may be used for these purposes. In the following discussion, wherever "software" or "code" is used, functionally comparable hard coded logic may be used in its place.

System control software 3358 may include instructions for controlling the timing, mixture of gases, flow rate of process gases, chamber and/or station pressure, chamber and/or station temperature, substrate temperature, target power levels, RF power levels, substrate pedestal, chuck and/or susceptor position, and other parameters of a particular process performed by processing tool 3300. System control software 3358 may be configured in any suitable way. For example, various process tool component subroutines or control objects may be written to control operation of the process tool components for performing various process tool processes. System control software 3358 may be coded in any suitable computer readable programming language.

In some embodiments, system control software 3358 may include input/output control (IOC) sequencing instructions for controlling the various parameters described above. For example, each phase of a fabrication process may include one or more instructions for execution by system controller 3350. The instructions for setting various process conditions for depositing low stress, doped silicon layers may be included. Examples of relevant process conditions are described herein.

Other computer software and/or programs stored on mass storage device 3354 and/or memory device 3356 associated with system controller 3350 may be employed in some embodiments. Examples of programs or sections of programs for this purpose include a substrate positioning program, a process gas control program, a pressure control program, a heater control program, and a plasma control program.

A substrate positioning program may include program code for process tool components that are used to load the substrate onto process station substrate holder 3318 and to control the spacing between the substrate and other parts of processing tool 3300.

A process gas control program may include code for controlling gas composition and flow rates and optionally for flowing gas into one or more process stations prior to deposition in order to stabilize the pressure in the process station. A pressure control program may include code for controlling the pressure in the process station by regulating, for example, a throttle valve in the exhaust system of the process station, a gas flow into the process station, etc.

A heater control program may include code for controlling the current to one or more heating units that are used to heat the substrate and/or processing chamber. Alternatively, the heater control program may control delivery of a heat transfer gas (such as helium) to the substrate.

A plasma control program may include code for setting RF power levels applied to the process electrodes in one or more process stations.

In some embodiments, there may be a user interface associated with system controller 3350. The user interface may include a display screen, graphical software displays of the apparatus and/or process conditions, and user input devices such as pointing devices, keyboards, touch screens, microphones, etc.

In some embodiments, parameters adjusted by system controller 3350 may relate to process conditions. Non-limiting examples include process gas composition and flow rates, temperature, pressure, plasma conditions (such as RF bias power levels), etc. These parameters may be provided to the user in the form of a recipe, which may be entered utilizing the user interface.

Signals for monitoring the process may be provided by analog and/or digital input connections of system controller 3350 from various process tool sensors. The signals for controlling the process may be output on the analog and digital output connections of processing tool 3300. Non-limiting examples of process tool sensors that may be monitored include mass flow controllers, pressure sensors (such as manometers), thermocouples, etc. Appropriately programmed feedback and control algorithms may be used with data from these sensors to maintain process conditions.

System controller 3350 may provide program instructions for implementing the above-described deposition processes. The program instructions may control a variety of process parameters, such as DC power level, RF bias power level, pressure, temperature, duration of exposure to processing gases and/or heat and/or other energy sources, etc. The instructions may control the parameters to operate in-situ deposition and further processing (e.g., patterning, etching, and activating) of film stacks according to various embodiments described herein.

Applications

Many types of device can be fabricated using stacks prepared as described herein. In various embodiments, the stacks have at least about 10 layers, or 5 pairs of layers. As mentioned, the layer pairs can contain a dielectric layer and a silicon layer, an undoped silicon layer and a doped silicon layer, etc. In some embodiments, a device stack includes at least about 10 pairs of layers, or at least about 15 pairs of layers, or at least about 20 pairs of layers, or at least about 25 pairs of layers. In some embodiments, a device stack includes at least about 70 layers. In some embodiments, the stack is employed in a memory device such as a VIM device.

Figure 7A:
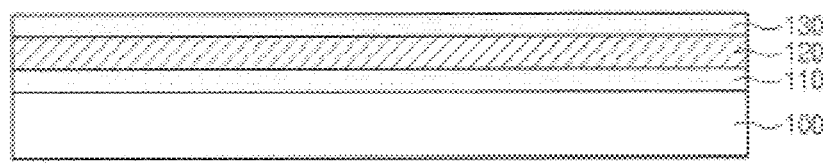
FIGS. 7A-7P show cross-sectional views illustrating a method for fabricating a nonvolatile memory device in accordance with a method disclosed herein.
Figure 7B:
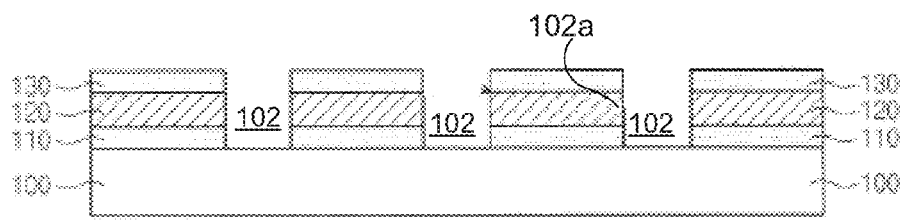
Figure 7C:
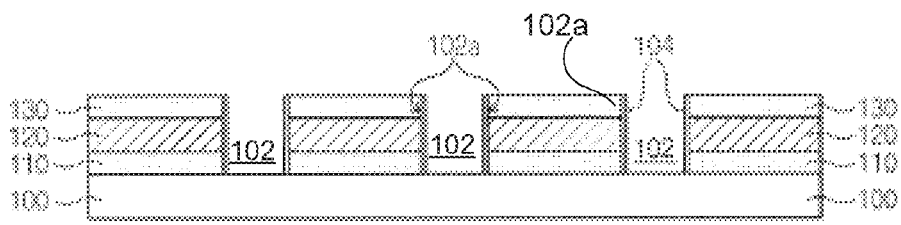
Figure 7D:
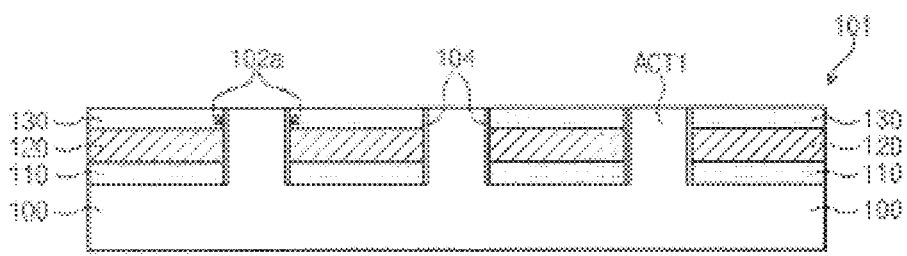
Figure 7E:
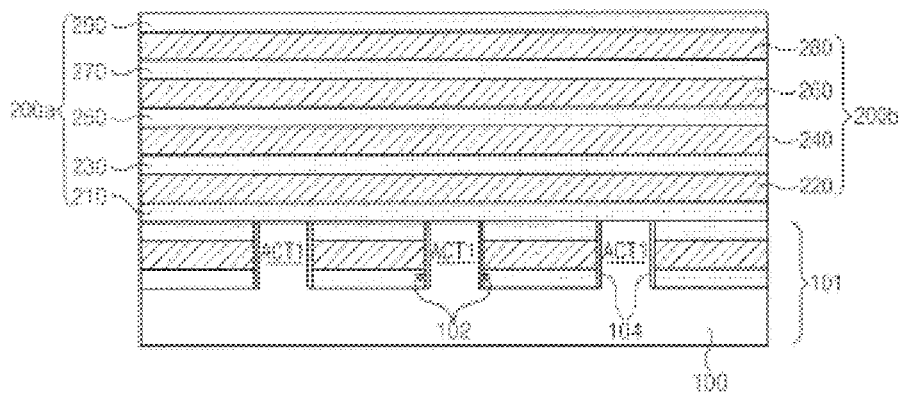
Figure 7F:
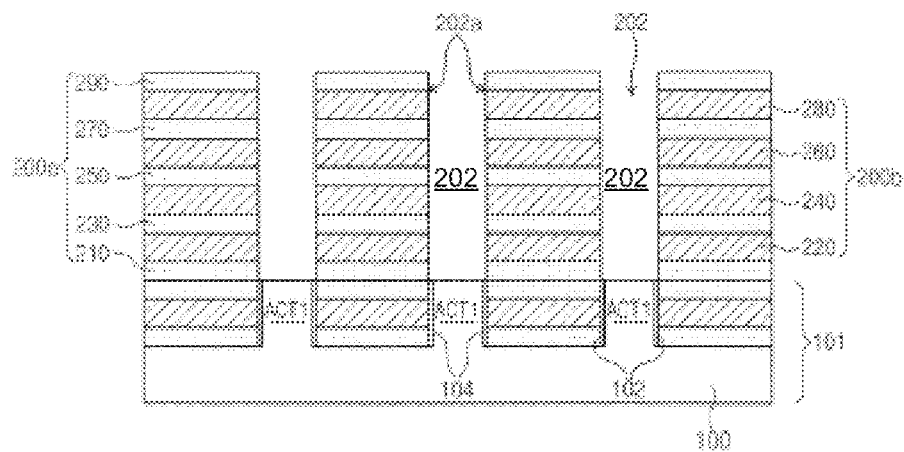
Figure 7G:
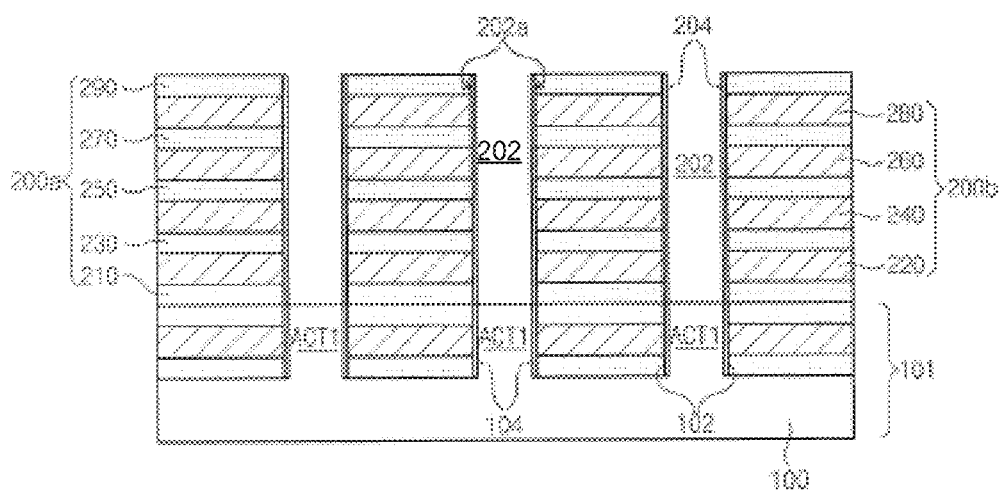
Figure 7H:
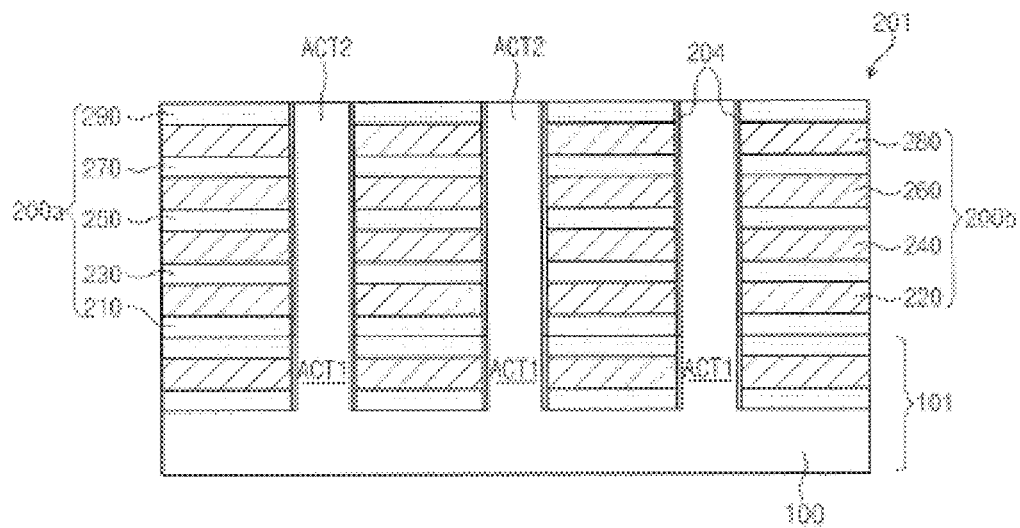
Figure 7I:
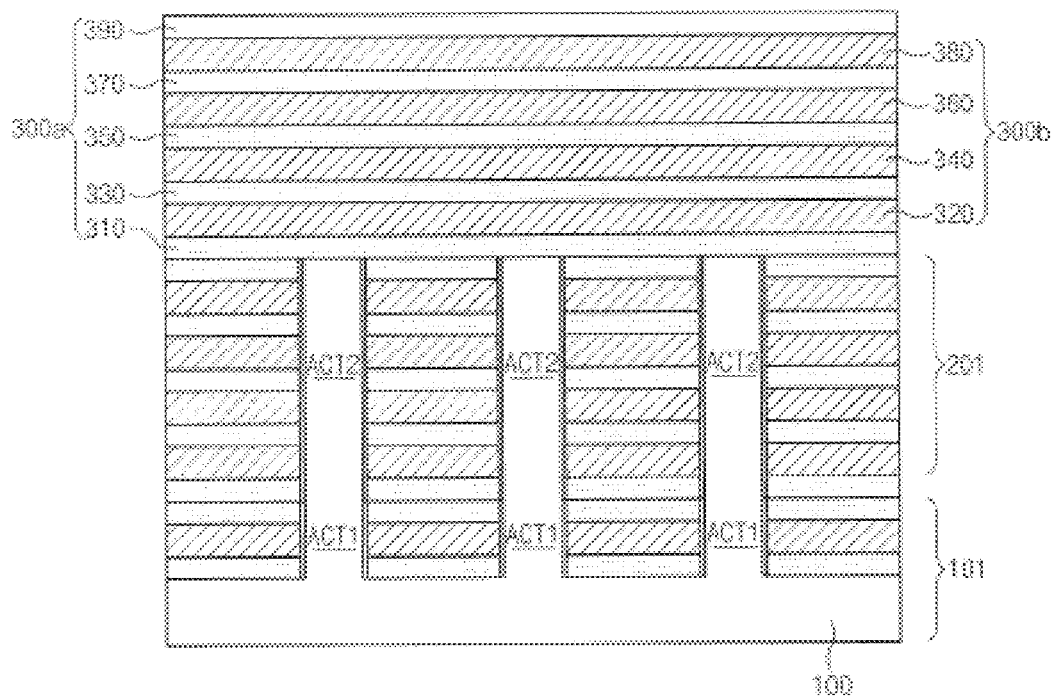
Figure 7J:
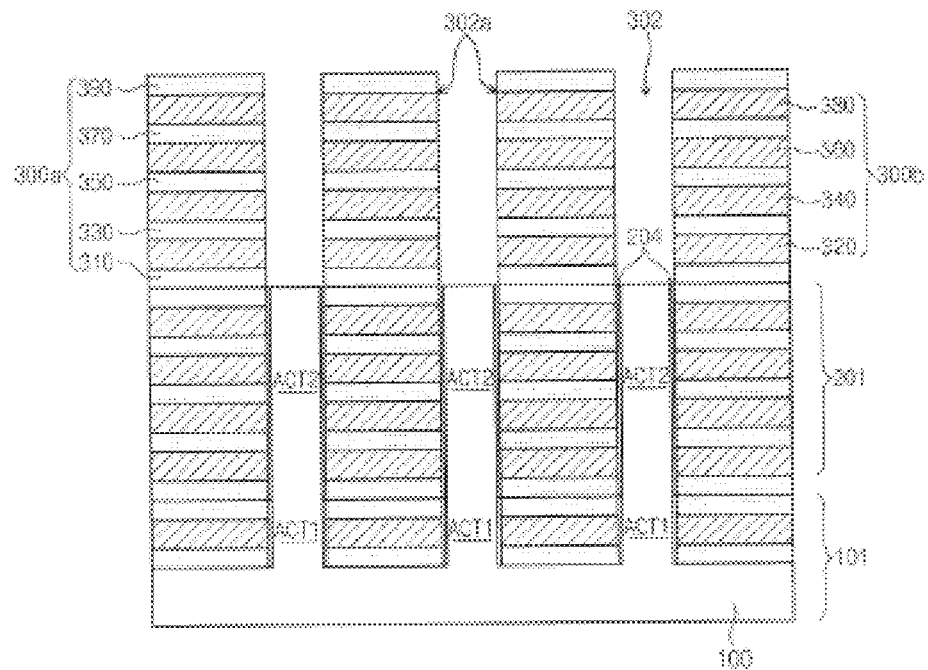
Figure 7K:
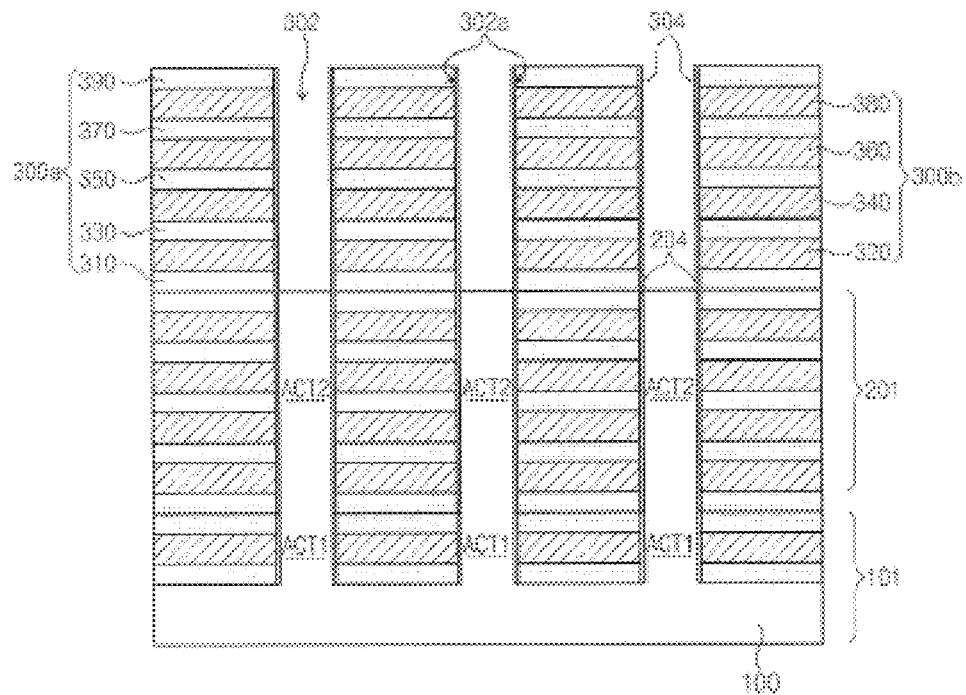
Figure 7L:
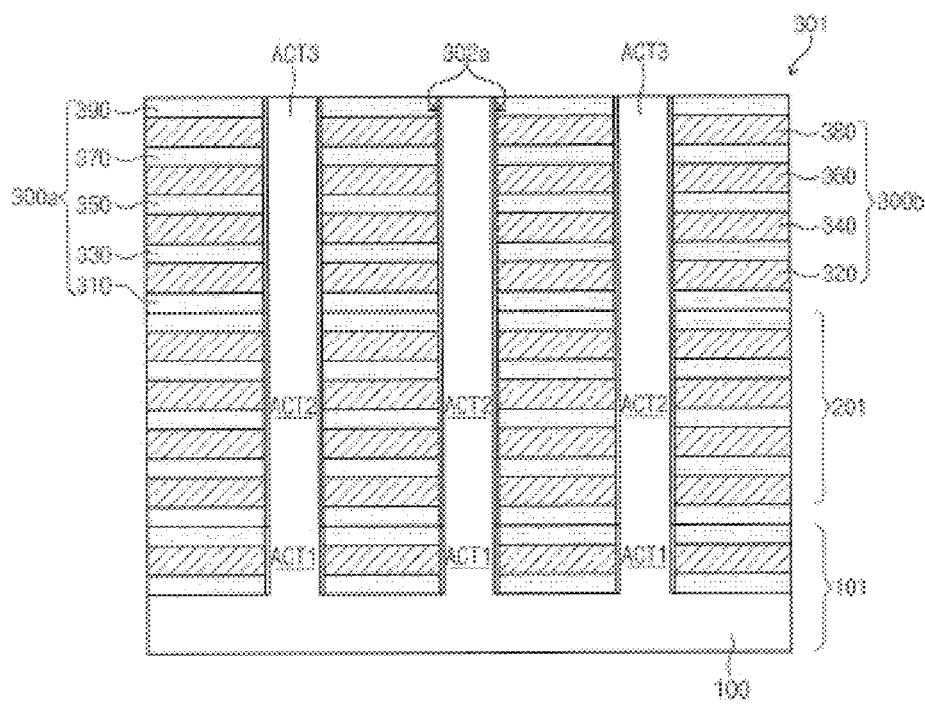
Figure 7M:
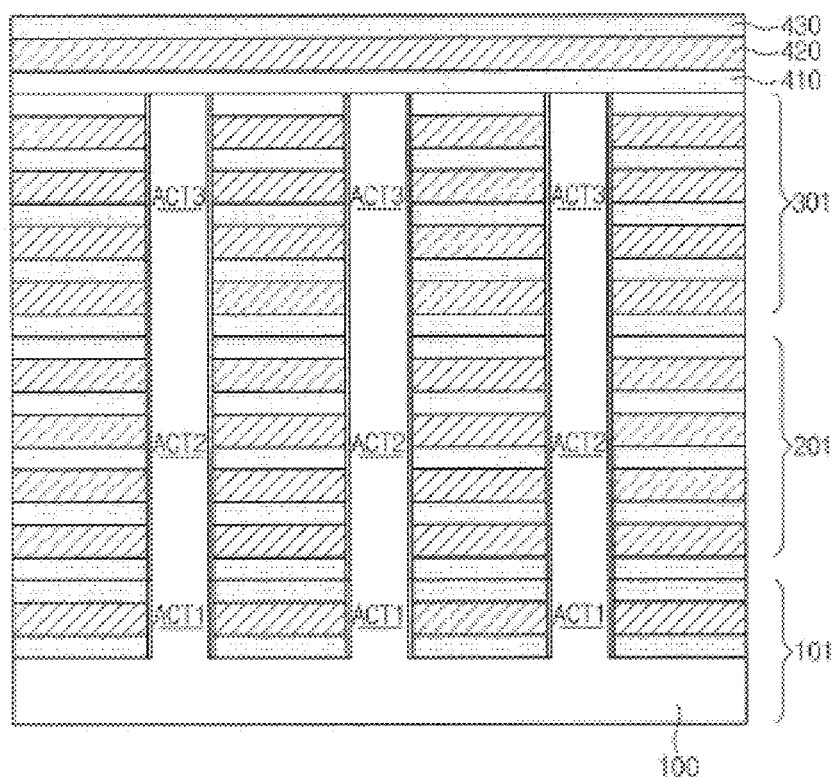
Figure 7N:
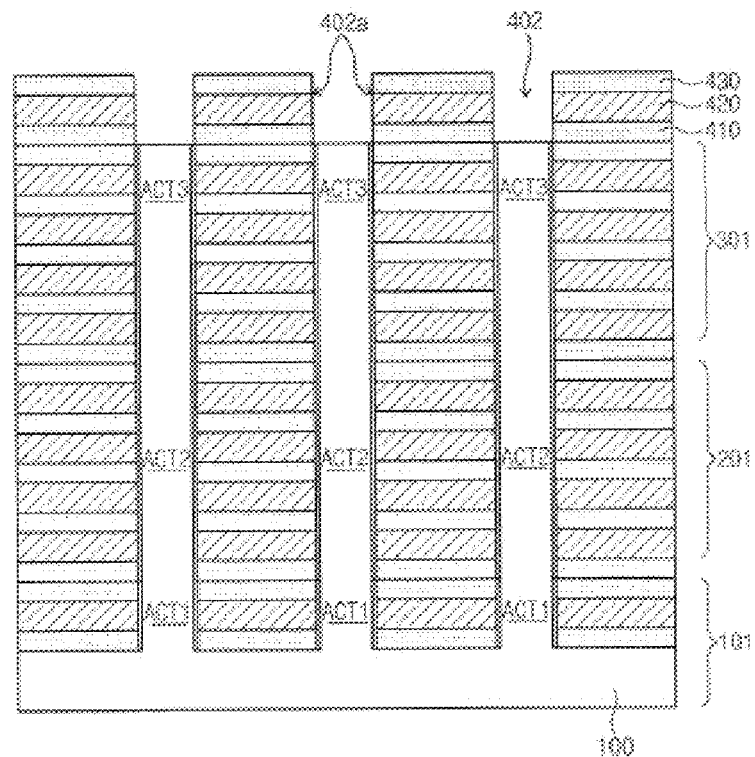
Figure 7O:
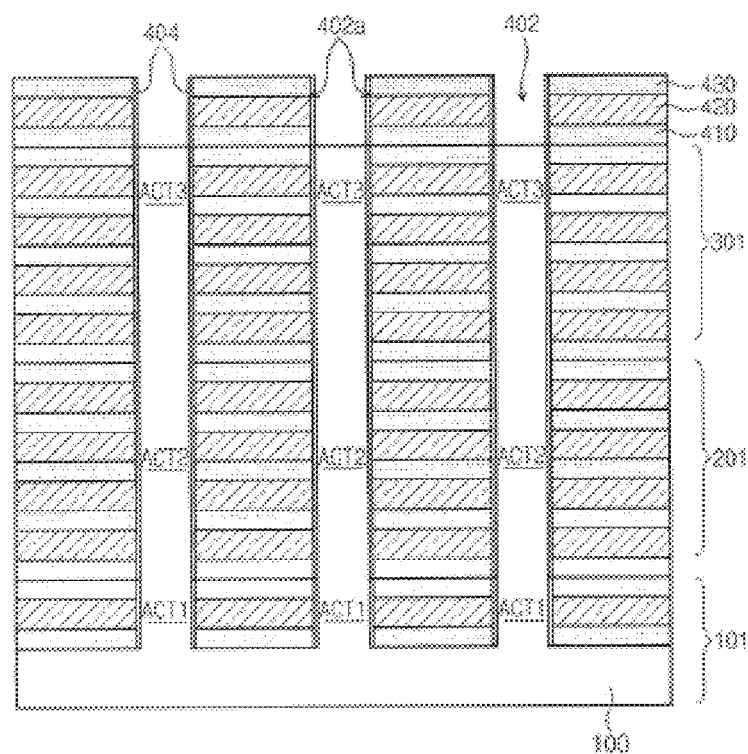
Figure 7P:
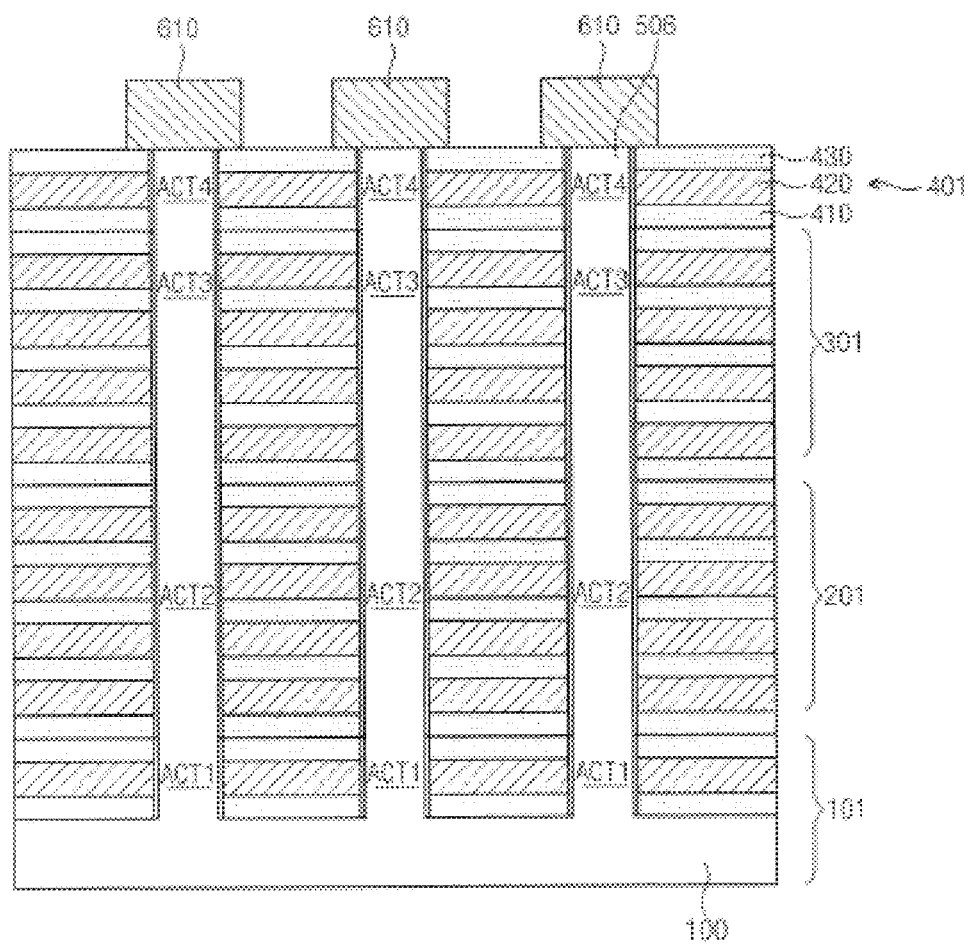

FIGS. 7A-7P depict fabrication of a memory device as disclosed herein using an exemplary set of steps. The steps depicted in FIGS. 7A-7P in no way limit the way in which a memory device as disclosed herein can be fabricated. It should also be noted that the figures are not necessarily to scale and do not necessarily depict the article at every state of preparation, i.e. intermediate stages of the article may not be illustrated in the sequence of figures. Further, the reference numbers used in FIGS. 7A-7P do not correspond to reference numbers in other figures, despite any overlap. The materials and processes discussed with respect to FIGS. 7A-7P also in no way limit materials or processes that can be utilized herein. This fabrication process is further discussed and described in U.S. patent application Ser. No. 12/612,125, filed Nov. 4, 2009, which is herein incorporated by reference in its entirety.

FIGS. 7A through 7P are cross-sectional views illustrating a method for manufacturing a nonvolatile memory device according to an embodiment of the present invention. Referring to FIG. 7A, an insulating layer 110, a conductive layer 120 and an insulating layer 130 are sequentially formed on a semiconductor substrate 100. The semiconductor substrate 100 may be doped with dopants of first conductivity type, for example, P-type dopants. The semiconductor substrate 100 may have a region having a different conductive type, i.e., a well region. The well region may be formed in a pocket well or a triple well structure. The insulating layers 110 and 130 may be formed by depositing an insulating material such as silicon oxide, silicon nitride, silicon oxynitride or the like. The conductive layer 120 may be used as a lower select gate. The conductive layer 120 (hereinafter, referred to as the "lower select gate") may be formed by depositing a conductive material, such as doped polycrystalline silicon or metal so that the conductive layer 120 can be used as a gate.

Referring to FIG. 7B, at least one opening 102 exposing the semiconductor substrate 100 is formed, by using, for example, a photolithography and etching process. The first opening 102 may have, for example, a circular or polygonal (e.g., rectangular) cross section. The first opening 102 is filled with silicon as will be described later, to form an active bar used as a channel of a transistor. If sidewalls 102a of the first opening 102 are formed inclined at a predetermined angle, the size of the active bar is varied with its height, so that the channel width of the transistor may not be uniform. Non-uniform channel width may act as a hindrance factor in realizing uniform electrical characteristics of a semiconductor memory device. Therefore, in some embodiments, the first opening 102 may be formed by using an anisotropic etching technique, for example, a dry etching technique such that the first opening 102 has the sidewalls 102a that are vertical to the-surface of the semiconductor substrate 100.

Referring to FIG. 7C, an insulating layer 104 is formed on the sidewalls 102a of the first opening 102. The insulating layer 104 may be used as a gate dielectric (hereinafter, referred to as a "first gate dielectric portion") of the lower select gate 120. In one example, the first gate dielectric portion 104 may be formed by depositing silicon oxide. In the deposition process for forming the first gate dielectric portion 104, silicon oxide may be deposited on the semiconductor substrate 100 that is exposed by the first opening 102. The silicon oxide deposited on the semiconductor substrate 100 may be removed by using an etching technique so that the semiconductor substrate 100 and an active bar to be described later are electrically connected to each other. A spacer for protecting the silicon oxide layer that is deposited on the sidewalls 102a of the first opening 102 from the etching may also be formed prior to the above-mentioned etching step.

Referring to FIG. 7D, a first active bar ACT1 is deposited in the first opening 102. The first active bar ACT1 may substantially fill the first opening 102. The first active bar ACT1 may be formed of the same material as the semiconductor substrate 100. In one example, the first active bar ACT1 may be formed by depositing a silicon layer and planarizing the deposited silicon layer through a chemical mechanical polishing (CMP) process. The silicon layer for forming the first active bar ACT1 may be formed by depositing polycrystalline silicon or amorphous silicon. In other embodiments, the first active bar ACT1 may be epitaxially grown from the portion of the semiconductor substrate 100 that is exposed by the first opening 102. In this case, the semiconductor substrate 100 and the first active bar ACT1 may be a single crystalline silicon which is continuous without crystalline defects. The first active bar ACT may be doped with the same conductivity type dopants as the semiconductor substrate 100. In some embodiments, the semiconductor substrate 100 and the first active bar ACT1 may have a P-type conductivity. Alternatively, the first active bar ACT1 may be not doped with dopants.

Through the foregoing processes, a first structure 101 including the semiconductor substrate 100, the lower select gate 120 above the semiconductor substrate 100, and the first active bar ACT1 used as a channel of the lower select gate 120 may be manufactured.

Referring to FIG. 7E, a first insulating layer group 200a and a first conductive layer group 200b are formed on the first structure 101. The first insulating layer group 200a may include a plurality of insulating layers 210, 230, 250, 270, 290. The first conductive layer group 200b may include a plurality of conductive layers 220, 240, 260, 280. The plurality of conductive layers 220, 240, 260, 280 and the plurality of insulating layers 210, 230, 250, 270, 290 may be alternatingly disposed to form a stacked sandwich structure. The insulating layer 210 may be positioned at the bottom of the stacked structure directly on the first structure 101, and the insulating layer 290 may be positioned at the top of the stacked structure to cover the conductive layer 280. Each of the plurality of conductive layers 220, 240, 260, 280 of the first conductive layer group 200b may be used as a cell gate pattern. The plurality of conductive layers 220, 240, 260, 280 may be formed by depositing doped polycrystalline silicon or metal. As used herein, the term "the first conductive layer group" 200b may be interchanged with the term "first cell gate pattern group", and the term "each of the plurality of conductive layers" 220, 240, 260, 280 may be interchanged with the term "first cell gate pattern."

Each of the plurality of conductive layers 220, 240, 260, 280 may have substantially the same thickness. Since thickness and/or interval of each of the plurality of conductive layers 220, 240, 260, 280 may determine a channel length, the thickness and/or interval of each of the plurality of conductive layers 220, 240, 260, 280 may be selected in a range that can solve limitations in the electrical characteristics due to a short channel. Also, since the plurality of conductive layers 220, 240, 260, 280 can be formed by deposition, the channel length can be controlled precisely.

The plurality of insulating layers 210, 230, 250, 270, 290 may be formed by depositing silicon oxide, for example. In further embodiments, the plurality of insulating layers 210, 230, 250, 270, 290 may be formed of high-k dielectric. In still further embodiments, each of the plurality of insulating layers 210, 230, 250, 270, 290 may be formed by depositing a material (e.g., silicon nitride, silicon oxynitride) having a dielectric constant higher than silicon oxide.

The number, thickness, material and the like of layers constituting the first insulating layer group 200a and the first conductive layer group 200b may be modified in various forms with consideration of electrical characteristics of a memory transistor and technical difficulties in the process of patterning these layers. Each of the first insulating layer group 200a and the first conductive layer group 200b may be formed in a step form.

Referring to FIG. 7F, the first insulating layer group 200a and the conductive layer group 200b are patterned via a photolithography and etching process to form a second opening 202 that exposes the first active bar ACT1. The first gate dielectric portion 104 may be exposed by the second opening 202. The second opening 202 may be formed by using, for example, a dry etching so as to have vertical sidewalls 202a and thus realize uniform electrical characteristics for a transistor. The first opening 102 and the second opening 202 can be connected in a vertical direction.

The number of the plurality of conductive layers 220, 240, 260, 280 constituting the first conductive layer group 200b and the number of the plurality of insulating layers 210, 230, 250, 270, 290 constituting the first insulating layer group 200a may be varied from the four-conductive-layer and five-insulating-layer embodiment depicted in the figures. In this embodiment, while the number of conductive layers 220, 240, 260, 280 constituting the first conductive layer group 200b is set at 4 layers and the number of insulating layers 210, 230, 250, 270, 290 constituting the first insulating layer group 200a is set at 5 layers, these numbers are arbitrary.

Referring to FIG. 7G, an insulating layer 204 is formed on the sidewalls 202a of the second opening 202. The insulating layer 204 may be used as a gate dielectric (hereinafter, referred to as the "second gate dielectric portion") of a first cell gate pattern group 200b. The second gate dielectric portion 204 may include a data storage layer. In one example, the second gate dielectric portion 204 may be formed in a triple layer structure by sequentially depositing a silicon oxide layer, a silicon nitride layer or a silicon oxynitride layer, and a silicon oxide layer or the like. In the second gate dielectric portion 204, the silicon nitride layer or the silicon oxynitride layer is used as a charge storage layer for trapping a charge and storing information, and any one of the two silicon oxide layers is used as a blocking barrier and the other is used as a tunnel barrier.

The second gate dielectric portion 204 may be formed on the first active bar ACT1 that is exposed by the second opening 202. The second gate dielectric portion 204 that is deposited on the first active bar ACT1 during the deposition process may be removed by using an etching technique so that the first active bar ACT1 and a second active bar ACT2 may be electrically connected to each other. Prior to this etching process, a spacer for protecting the second gate dielectric portion 204 that is deposited on the sidewalls 202a of the second opening 202 from the etching may be formed.

Referring to FIG. 7H, a second active bar ACT2 is formed in the second opening 202 by using a process that is the same as or similar to that described with reference to FIG. 7D. The second active bar ACT2 may be connected to the first active bar ACT1 in a vertical direction, and may also be connected to the surface of the semiconductor substrate 100. The second active bar ACT2 may be formed of the same material as the first active bar ACT1. In some embodiments, the second active bar ACT2 may be formed by depositing amorphous or polycrystalline silicon and planarizing the deposited amorphous or polycrystalline silicon layer through a chemical mechanical polishing (CMP) process. In other embodiments, the second active bar ACT2 may be formed by epitaxially growing single crystalline silicon from the first active bar ACT1. The second active bar ACT2 may be formed to have the same conductivity type as the semiconductor substrate 100 and the first active bar ACT1, for example, P-type conductivity. Alternatively, the semiconductor substrate 100 and the first and second active bars ACT1 and ACT2 may not be doped with dopants.

Through the foregoing processes, a second structure 201 including the plurality of cell gate patterns 220, 240, 260, 280 on the first structure 101, and the second active bar ACT2 that is used as a channel of the plurality of cell gate patterns 220, 240, 260, 280 can be formed.

Referring to FIG. 7I, a second insulating layer group 300a that includes a plurality of insulating layers 310, 330, 350, 370, 390 and a second conductive layer group 300b that includes a plurality of conductive layers 320, 340, 360, 380 which are alternatingly disposed with the plurality of insulating layers 310, 330, 350, 370, 390 are formed in a stacked sandwich structure by using a process that is the same as or similar to that described with reference to FIG. 7E. The insulating layer 310 is disposed at the bottom of the stack, directly on the second structure 201, and the insulating layer 390 is at the top of the stack and covers the conductive layer 380. Each of the plurality of conductive layers 320, 340, 360, 380 of the second conductive layer group 300b may be used as a cell gate pattern. For this purpose, the plurality of conductive layers 320, 340, 360, 380 may be formed by depositing doped polycrystalline silicon or metal. The plurality of conductive layers 320, 340, 360, 380 may each have substantially the same thickness. In this specification, the term "second conductive layer group 300b" may be exchanged with the term "second cell gate pattern group", and the term "each of the plurality of conductive layers" 320, 340, 360, 380 may be exchanged with the term in "each second cell gate pattern." The plurality of insulating layers 310, 330, 350, 370, 390 may be formed by depositing silicon nitride or silicon oxynitride having a dielectric constant higher than silicon oxide. Each of the second insulating layer group 300a and the second conductive layer group 300b may be formed in a step form.

Referring to FIG. 7J, the second insulating layer group 300a and the second conductive layer group 300b are patterned using a process that is the same as or similar to that described with reference to FIG. 7F to form a third opening 302 that exposes the second active bar ACT2. The second gate dielectric portion 204 may be exposed by the third opening 302. The third opening 302 may be formed using, for example, a dry etching process so as to provide an opening having vertical sidewalls 302 and to thus realize uniform electrical characteristics for the transistors. The second opening 202 and the third opening 302 may be connected in a vertical direction. Although the third opening 302 is formed inclined with a predetermined angle, the number of conductive layers 320, 340, 360, 380 constituting the second conductive layer group 300b and the number of insulating layers 310, 330, 350, 370, 390 constituting the second insulating layer group 300a may be selected such that a third active bar can be formed at a height that can neglect an increasing degree of cell dispersion.

In one example, the second conductive layer group 300b and the first conductive layer group 200b may be formed in the same structure and the second insulating layer group 300a and the first insulating layer group 200a may be formed in the same structure.

Referring to FIG. 7K, an insulating layer 304 is formed on the sidewalls 302a of the third opening 302 using a process that is the same as or similar to that described with reference to FIG. 7G. The insulating layer 304 may be used as a gate dielectric (hereinafter, referred to as the "third gate dielectric") of the second cell gate pattern group 300b. The third gate dielectric portion 304 may be formed with the same structure as the second gate dielectric portion 204. In one example, the third gate dielectric portion 304 may be formed in a triple layer structure by sequentially depositing a silicon oxide layer that acts as a blocking barrier, a silicon nitride layer or a silicon oxynitride layer that acts as a charge storage layer, and a silicon oxide layer that acts as a tunnel barrier.

In the deposition process for forming the third gate dielectric portion 304, the third gate dielectric portion 304 may be deposited on the second active bar ACT2 that is exposed by the third opening 302. The third gate dielectric portion that is deposited on the second active bar ACT2 may be removed via etching. A spacer for protecting the third gate dielectric portion 304 deposited on the sidewalls 302a of the third opening 302 from the etching may be formed prior to the etching operation.

Referring to FIG. 7L, a third active bar ACT3 is deposited in the third opening 302 using a process that is the same as or similar to that described with reference to FIG. 7D. The third active bar ACT3 may be connected to the second active bar ACT2 in a vertical direction and to the surface of the semiconductor substrate 100. The third active bar ACT3 may be formed of the same material as the second active bar ACT2. In some embodiments, the third active bar ACT3 may be formed by depositing amorphous or polycrystalline silicon and then planarizing the deposited amorphous or polycrystalline silicon layer through a chemical mechanical polishing (CMP) process, or by epitaxially growing a single crystalline silicon layer from the second active bar ACT2. The third active bar ACT3 may be formed with the same conductivity type as the semiconductor substrate 100, the first active bar ACT1 and the second active bar ACT2, for example, P-type conductivity. In other embodiments, the semiconductor substrate 100, the first, second and third active bars may not be doped with dopants.

Through the foregoing processes, a third structure 301 including the plurality of cell gate patterns 320, 340, 360, 380 on the second structure 201, and the third active bar ACT3 used as a channel of the plurality of cell gate patterns 320, 340, 360, 380 can be formed.

Referring to FIG. 7M, an insulating layer 410, a conductive layer 420, and an insulating layer 430 are sequentially formed on the third structure 301 by, for example, a process that is the same as or similar to that described with reference to FIG. 7A. The insulating layers 410, 430 may be formed by depositing an insulating material such as silicon oxide, silicon nitride, silicon oxynitride or the like. The conductive layer 420 may be used as an upper select gate. The conductive layer 420 (hereinafter, referred to as the "upper select gate") may be formed by depositing a conducive material layer, for example, doped polycrystalline silicon or metal such that the conductive layer 420 can be used as a gate.

Referring to FIG. 7N, a fourth opening 402 that exposes the third active bar ACT3 is formed via a process that is the same as or similar to that described with reference to FIG. 7B. The fourth opening 402 may be formed using, for example, a dry etching process so as to have substantially vertical sidewalls 402a.

Referring to FIG. 7O, an insulating layer 404 is formed on sidewalls 402a of the third opening 302 via a process that is the same as or similar to that described with reference to FIG. 7C. The insulating layer 404 may be used as a gate dielectric (hereinafter, referred to as the "fourth gate dielectric") of the upper select gate 420. The fourth gate dielectric 404 may be formed by depositing, for example, a silicon oxide layer. In the deposition process for forming the fourth gate dielectric 404, the silicon oxide layer may be deposited on the third active bar ACT3 that is exposed by the fourth opening 402. The silicon oxide layer deposited on the third active bar ACT3 may be removed using an etching process. In this case, a spacer for protecting the silicon oxide layer that is deposited on the sidewalls 402a of the fourth opening 402 from the etching may be formed prior to the etching step.

Referring to FIG. 7P, a fourth active bar ACT4 is formed in the fourth opening 402 using a process that is the same as or similar to that described with reference to FIG. 7D. The fourth active bar ACT4 may be connected to the third active bar ACT3 in a vertical direction and to the surface of the semiconductor substrate 100. The fourth active bar ACT4 may be formed of the same material as the third active bar ACT3. In some embodiments, the fourth active bar ACT4 may be formed by depositing amorphous or polycrystalline silicon and then planarizing the deposited amorphous or polycrystalline silicon layer through a chemical mechanical polishing (CMP) process. In other embodiments, the fourth active bar ACT4 may be formed by epitaxially growing a single crystalline silicon layer from the third active bar ACT3. The fourth active bar ACT 4 may be formed to have the same conductivity type as the semiconductor substrate 100, for example, P-type conductivity. In other embodiments, the semiconductor substrate 100, the first, second, third and fourth active bars ACT1, ACT2, ACT3 and ACT 4 may not be doped with dopants.

Through the foregoing processes, a fourth structure 401 that includes the upper select gate and the fourth active bar ACT4 (which is used as a channel of the upper select gate) can be formed on the third structure 301. The active bar which is formed on the semiconductor substrate 100 may be formed of the same material (e.g., silicon) as the semiconductor substrate 100, and may have the same conductivity type as the semiconductor substrate 100.

In particular, since the active bar ACT is formed by separately forming the first to fourth active bars ACT1 to ACT 4, it is possible to minimize a width difference according to height of each of the first to fourth active bars ACT1 to ACT 4. Accordingly, since the width of the active bar ACT can be set to not vary greatly according to its height, deterioration of cell dispersion characteristics can be reduced and/or minimized.

A bit line 610 that is electrically connected to the active bar ACT may be formed on the fourth structure 401. The bit line 610 may be formed to extend in a direction that crosses the upper select gate 420. In one example, the bit line 610 may be formed by depositing an aluminum layer on the fourth structure 401 and then patterning the deposited aluminum layer through a photolithography and etching process.

Additionally, the apparatus and methods described herein may be used in conjunction with lithographic patterning tools or processes, for example, for the fabrication or manufacture of semiconductor devices, displays, LEDs, photovoltaic panels and the like that incorporate stacks as described. Typically, though not necessarily, such tools/processes will be used or conducted together in a common fabrication facility. Lithographic patterning of a film typically comprises some or all of the following steps, each step enabled with a number of possible tools: (1) application of photoresist on a workpiece, i.e., substrate, using a spin-on or spray-on tool; (2) curing of photoresist using a hot plate or furnace or UV curing tool; (3)

exposing the photoresist to visible or UV or extreme UV light or an electron beam with a tool such as a wafer stepper; (4) developing the resist so as to selectively remove resist and thereby pattern it using a tool such as a wet bench; (5) transferring the resist pattern into an underlying film or workpiece by using a dry or plasma-assisted etching tool; and (6) removing the resist using a tool such as an RF or microwave plasma or wet resist stripper. One embodiment is a method as described herein further including: applying photoresist to the wafer to define the locations of silicon containing stacks; exposing the photoresist to an energy source; patterning the resist and transferring the pattern to the wafer; and selectively removing the photoresist from the wafer. One embodiment is system including an apparatus as described herein further comprising a stepper.

It is to be understood that the configurations and/or approaches described herein are exemplary in nature, and that these specific embodiments or examples are not to be considered in a limiting sense, because numerous variations are possible. The specific routines or methods described herein may represent one or more of any number of processing strategies. As such, various acts illustrated may be performed in the sequence illustrated, in other sequences, in parallel, or in some cases omitted. Likewise, the order of the above described processes may be changed.

The subject matter of the present disclosure includes all novel and nonobvious combinations and sub-combinations of the various processes, systems and configurations, and other features, functions, acts, and/or properties disclosed herein, as well as any and all equivalents thereof.

Experimental

The following section and figures relate the results of experiments that were performed to demonstrate the effects of processing parameters discussed above on the characteristics of the stack structure and layers therein.

The experiments shown in FIGS. 8-11 produced a single layer of doped silicon of 1000 Å thick on a 1000 Å thick thermal oxide. In contrast, the experiments shown in FIG. 12 produced a stack comprising 73 layers, which stack includes alternating layers of oxide (200 Å thick) and doped silicon (300 Å thick), starting and ending with oxide.

The experiments were conducted in a 300 mm VECTOR® STRATA™ module. Phosphine was provided as a 5% composition and 95% helium by volume. The reaction pressure was 6 Torr. In these experiments, a process gas comprising silane and phosphine was used to deposit a layer of phosphorus doped silicon film on a 300 mm diameter wafer in a four showerhead four wafer station reaction chamber. Rapid thermal anneal conditions were used to accomplish activation.

Table 1 shows data of a series of experiments demonstrating the impact of silane mass flow rate, high-frequency radiofrequency power, deposition temperature, and phosphine mass flow rate on the beneficial properties of the deposited film including internal stress, smoothness, and conductivity. The experiments were conducted in blocks, each block containing three to four experiments. Both the silane flow rate and the phosphine flow rate were constant within a block, and they varied between blocks. For instance, for block one, silane flow rate was 915 sccm and phosphine flow rate was 457.5 sccm (phosphine is provided as a 5% composition and 95% helium). For block six, silane flow rate was 1450 sccm and phosphine flow rate was 725 sccm (phosphine is provided as a 5% composition and 95% helium), and so on. The CP block data were obtained using the SiH$_4$ flow set-point center point of the experiments. All experiments were conducted while maintaining a substrate pedestal temperature of 525° C. Each of the three or four experiments in a block was conducted at a different high-frequency RF power, ranging from 250 to 1000.

Table 1 also shows data of the deposition rate (Å/minute), the mean and range of the thickness of the layer as deposited (Å), thickness non-uniformity and half-radius thickness non-uniformity (%), and stress (MPa) and bow (μm) of the layer.

TABLE 1

| Block | HDR DOE3 Recipe | Pedestal Temp ° C. | SIH4 | HF RF | Trans | PH3 Flow | DepRate (Å/Min) | THK Mean | THK Range | THK NU % | THK R/2 NU % | Stress (MPa) | Bow (um) |
|---|---|---|---|---|---|---|---|---|---|---|---|---|---|
| One | 1 | 525 | 915 | 500 | 7 | 457.5 | 1469 | 996 | 29 | 0.6 | 1.46 | −116 | −9 |
|  | 2 | 525 | 915 | 750 | 7 | 457.5 | 1694 | 978 | 25 | 0.7 | 1.3 | −112 | −8 |
|  | 3 | 525 | 915 | 250 | 7 | 457.5 | 989 | 1001 | 36 | 1.1 | 1.8 | −131 | −9 |
| Two | 4 | 525 | 1022 | 500 | 7 | 511 | 1492 | 979 | 26 | 0.7 | 1.34 | −97 | −6 |
|  | 5 | 525 | 1022 | 750 | 7 | 511 | 1761 | 976 | 24 | 0.6 | 1.21 | −149 | −10 |
|  | 6 | 525 | 1022 | 250 | 7 | 511 | 1008 | 1014 | 41 | 1.3 | 2.04 | −135 | −9 |
| Three | 7 | 525 | 1129 | 500 | 7 | 564.5 | 1537 | 977 | 23 | 0.7 | 1.17 | −94 | −7 |
|  | 8 | 525 | 1129 | 750 | 7 | 564.5 | 1827 | 979 | 20 | 0.5 | 1.04 | −138 | −10 |
|  | 9 | 525 | 1129 | 250 | 7 | 564.5 | 1016 | 1010 | 52 | 1.6 | 2.55 | −109 | −8 |
|  | 10 | 525 | 1129 | 1000 | 7 | 564.5 | 2090 | 1008 | 26 | 0.5 | 1.27 | −179 | −12 |
| CP Block | CP1 | 525 | 1182.5 | 500 | 7 | 591.3 | 1556 | 978 | 24 | 0.7 | 1.2 | −85 | −6 |
|  | CP2 | 525 | 1182.5 | 750 | 7 | 591.3 | 1860 | 985 | 25 | 0.6 | 1.26 | −125 | −9 |
|  | CP3 | 525 | 1182.5 | 250 | 7 | 591.3 | 1018 | 1006 | 64 | 1.9 | 3.19 | −130 | −9 |
|  | CP4 | 525 | 1182.5 | 1000 | 7 | 591.3 | 2055 | 978 | 20 | 0.5 | 1.02 | −179 | −12 |
| Four | 11 | 525 | 1236 | 500 | 7 | 618 | 1571 | 993 | 33 | 1.1 | 1.65 | −79 | −6 |
|  | 12 | 525 | 1236 | 750 | 7 | 618 | 1883 | 997 | 24 | 0.8 | 1.19 | −122 | −9 |
|  | 13 | 525 | 1236 | 250 | 7 | 618 | 1019 | 1010 | 74 | 2.3 | 3.64 | −126 | −9 |
| Five | 14 | 525 | 1343 | 500 | 7 | 671.5 | 1604 | 1000 | 43 | 1.4 | 2.15 | −77 | −6 |
|  | 15 | 525 | 1343 | 750 | 7 | 671.5 | 1940 | 979 | 22 | 0.8 | 1.13 | −99 | −7 |
|  | 16 | 525 | 1343 | 250 | 7 | 671.5 | 1053 | 1044 | 62 | 1.7 | 2.99 | −126 | −9 |
| Six | 17 | 525 | 1450 | 500 | 7 | 725 | 1655 | 1030 | 40 | 1.1 | 1.95 | −75 | −5 |
|  | 18 | 525 | 1450 | 750 | 7 | 725 | 2003 | 1017 | 30 | 0.7 | 1.46 | −80 | −6 |
|  | 19 | 525 | 1450 | 250 | 7 | 725 | 1038 | 1013 | 83 | 2.5 | 4.12 | −128 | −9 |

Figure 8A:
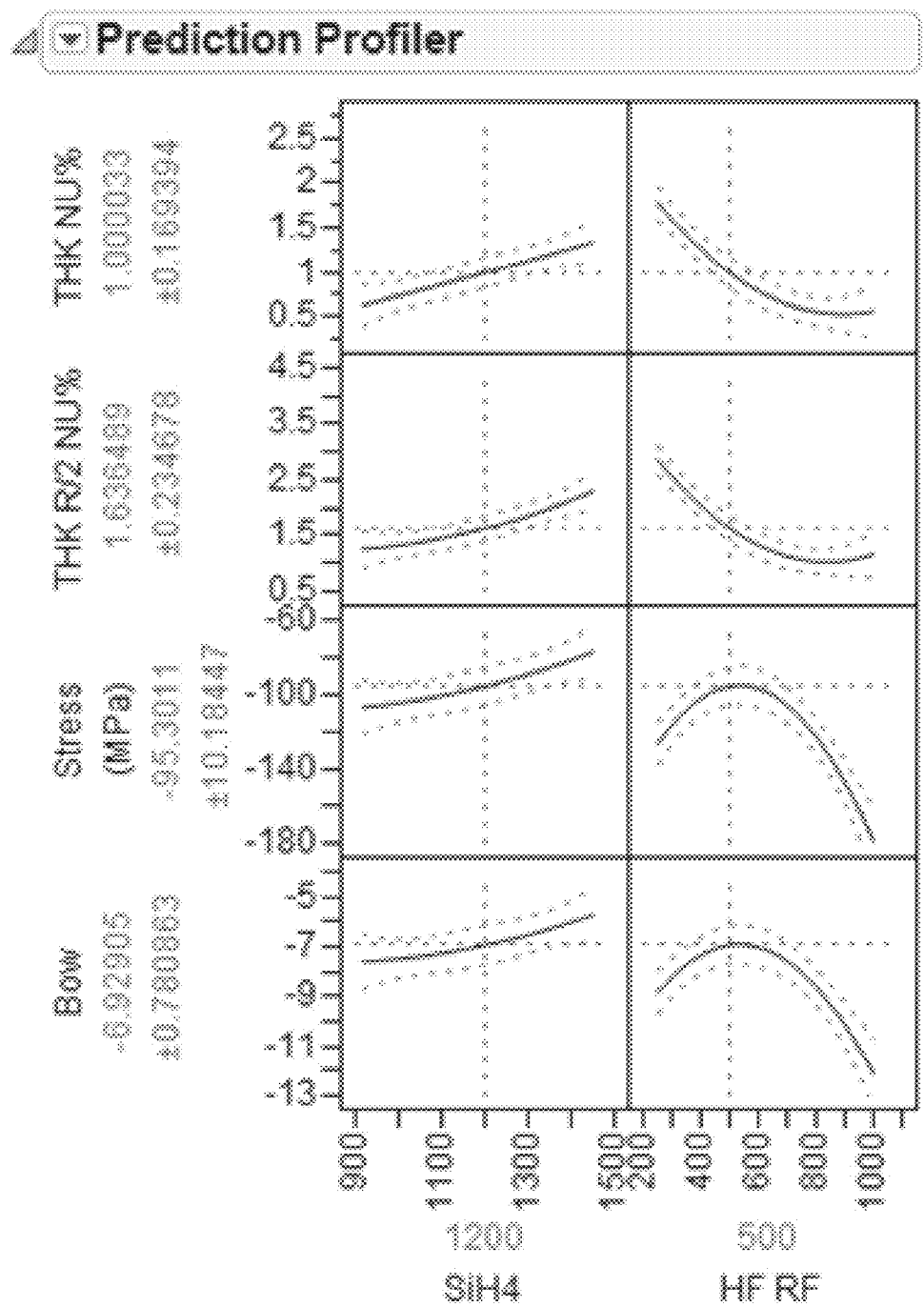
FIGS. 8A-8C show the bow, internal stress, and thickness non-uniformity as functions of silane flow rate (left panel) and the high-frequency RF power (right panel) in a series of experiments producing a phosphine doped silicon layer.
Figure 8B:
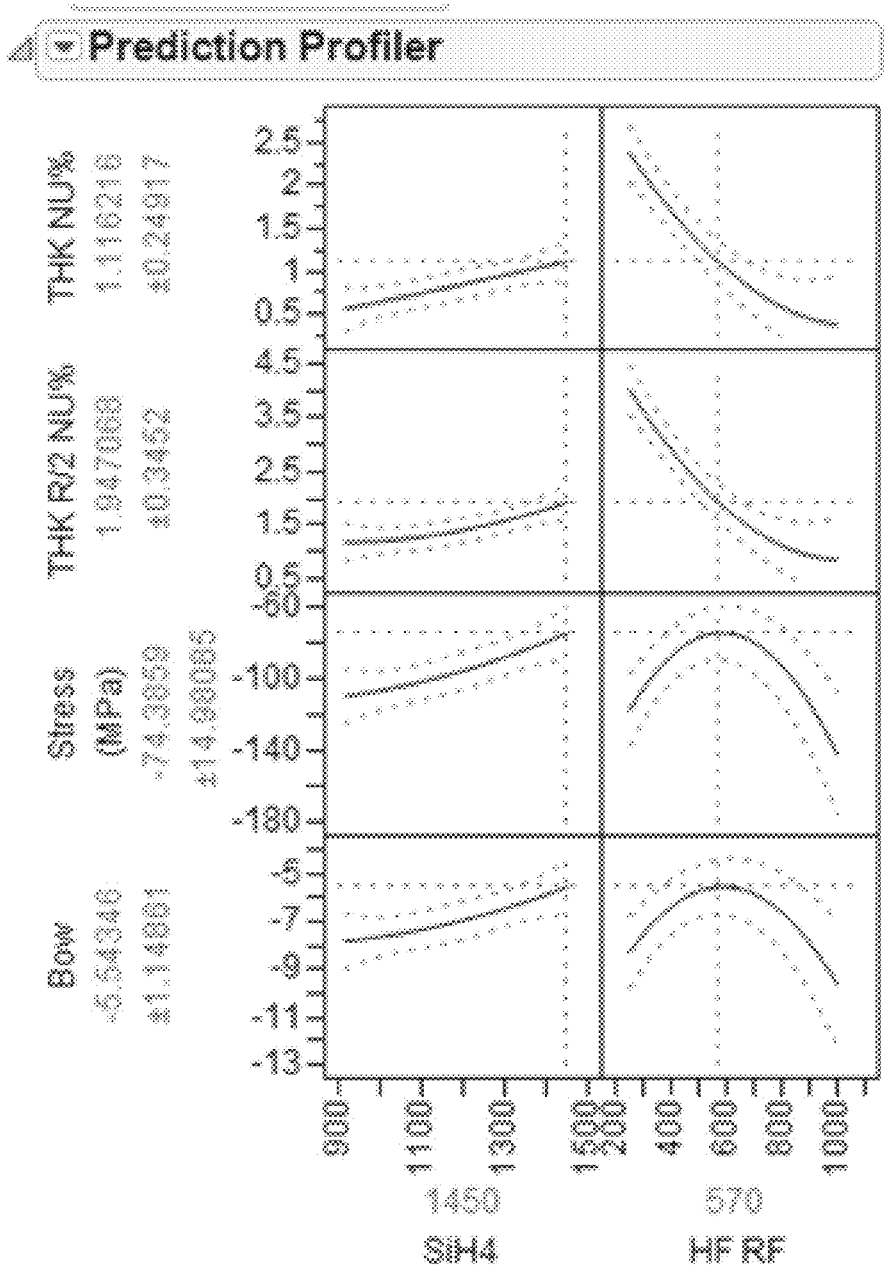
Figure 8C:
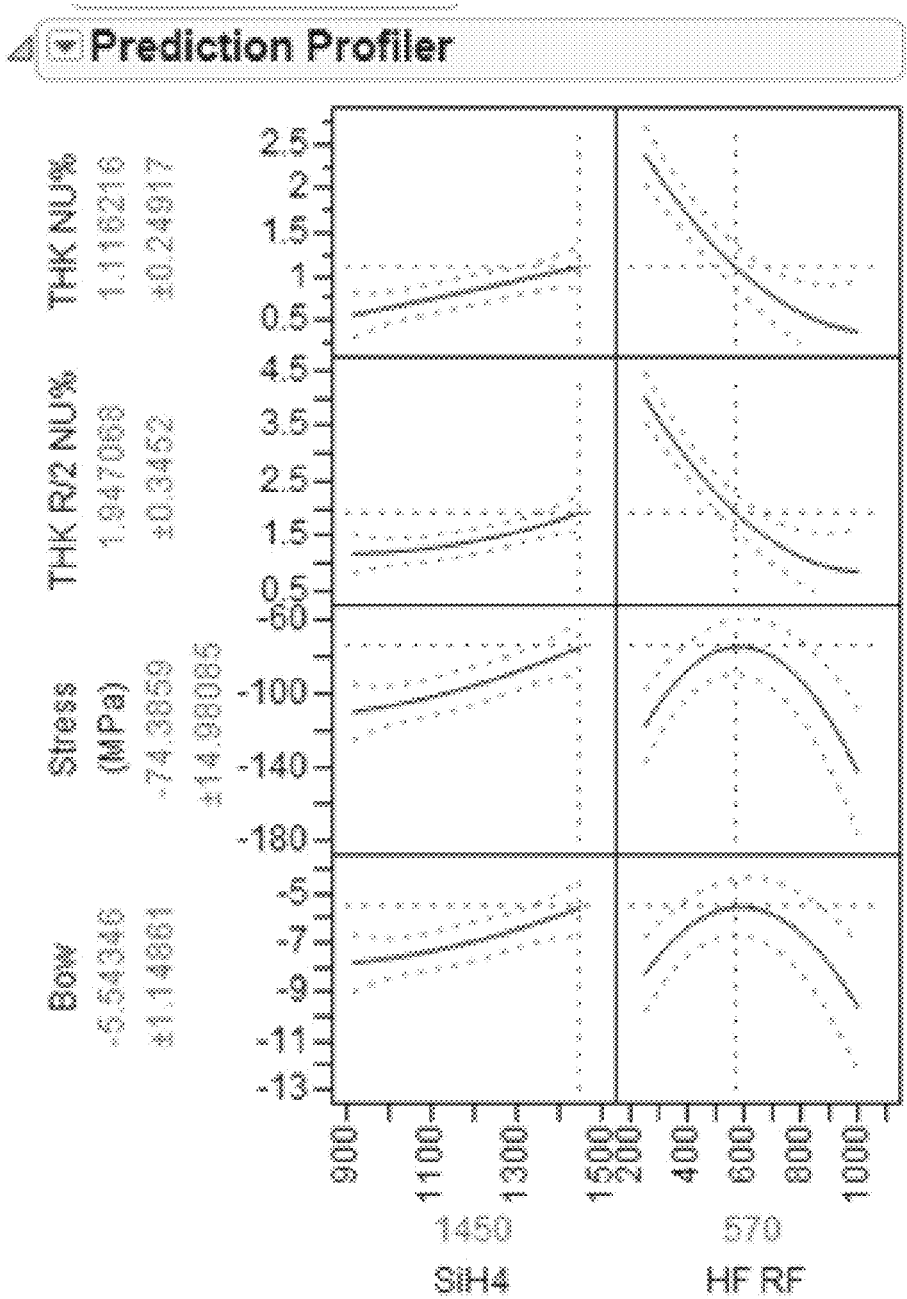

Data shown in Table 1 were used to generate plots in FIGS. 8A-8C. The plots show the bow, internal stress, and thickness non-uniformity as functions of silane flow rate (left panel) and the high-frequency RF power (right panel). Each data point in the left panel of a figure is based on a value averaged across multiple high-frequency RF voltages. A smooth curve is fitted to data points in a plot and shown as a solid curve, while corresponding estimated errors are shown by dash lines. Each data point in the right panel is based on a value averaged across multiple silane flow rates.

FIGS. 8A-8C show the same data, but they identify independent variable (IV) values (silane flow rate and HF RF power) for 3 specific dependent variable (DV) values based on the fitted curves: center point of stress (FIG. 8A), lowest stress (FIG. 8B), and best uniformity (FIG. 8C). Based on the identified IV values, associated DV other than the 3 specific DV values are also identified in each subplot of FIGS. 8A-8C. Specifically, the center point of stress corresponds to a silane flow rate of 1200 sccm, and HF RF power of 500 W, see FIG. 8A. The lowest stress occurs at a silane flow rate of 1450 sccm, and HF RF power of 570 W, see FIG. 8B. The best non-uniformity also occurs at a silane flow rate of 1450 sccm, and HF RF power of 570 W, see FIG. 8C. Importantly, increasing silane flow rates correspond to reduced bow and compressive internal stress, and improved uniformity of the silicon layer (see respective subplots from bottom to top, left panels of FIGS. 8A-8C).

Figure 9:
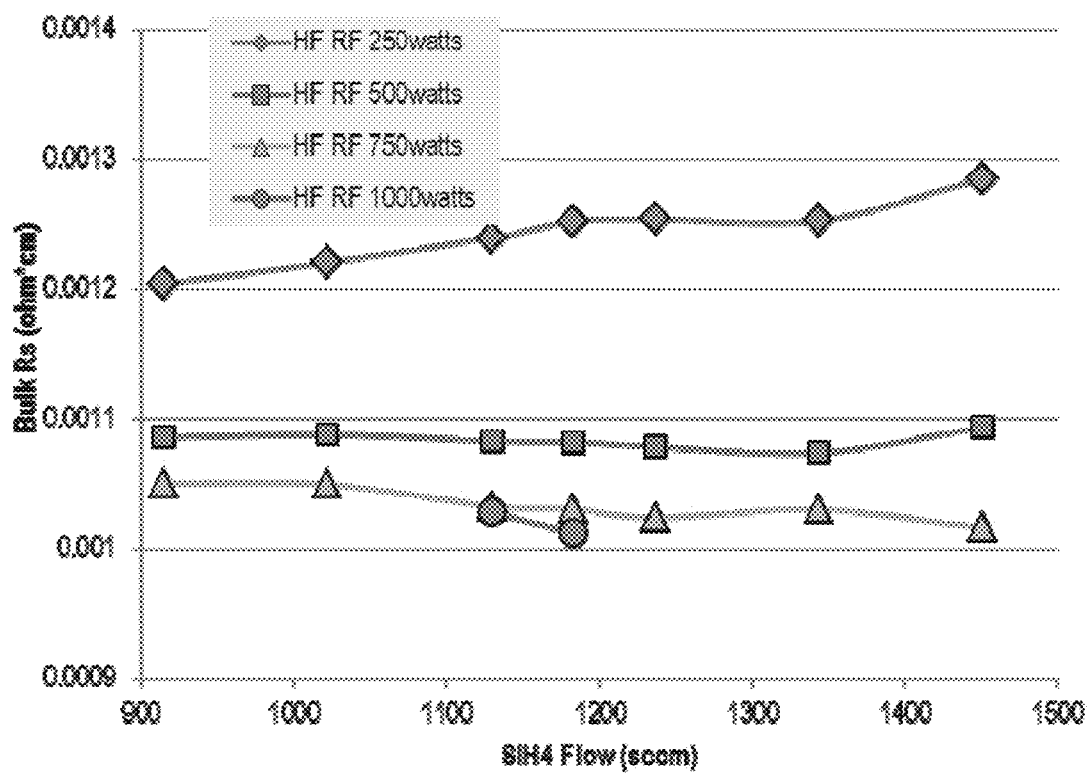
FIG. 9 shows the impact of high-frequency RF power on the bulk resistivity of the deposited silicon film in a series of experiments producing a phosphine doped silicon layer.

FIG. 9 depicts the impact of high-frequency RF power on the bulk resistivity of the deposited silicon film after it was annealed or activated using rapid thermal annealing. It shows that relatively high power is required in order to reduce the bulk resistivity of the activated film below 0.0011 ohm-centimeter. This figure suggests to me that the high-frequency RF power should be at about 500 W or higher, or 1000 W or higher, in order to obtain suitably low resistivity in the silicon film. FIG. 9 also shows bulk resistivity as a function of silane flow rate. However, silane flow rate does not seem to consistently modulate resistivity under different high-frequency RF power.

FIGS. 10A and 10B show the impact of phosphine to silane flow rate ratio on the bulk resistivity and sheet resistance of the deposited silicon films after activation. As can be seen from the plots, the percentage of phosphine in the phosphine silane mixture lower than about 3.5% leads to relatively low bulk resistivity (<0.00115 ohm·cm in FIG. 10A) and sheet resistance (<400 ohm·square in FIG. 10B). Here, the percentage of phosphine is calculated as $100*(PH_3/SiH_4)$ per volume.

Figure 11A:
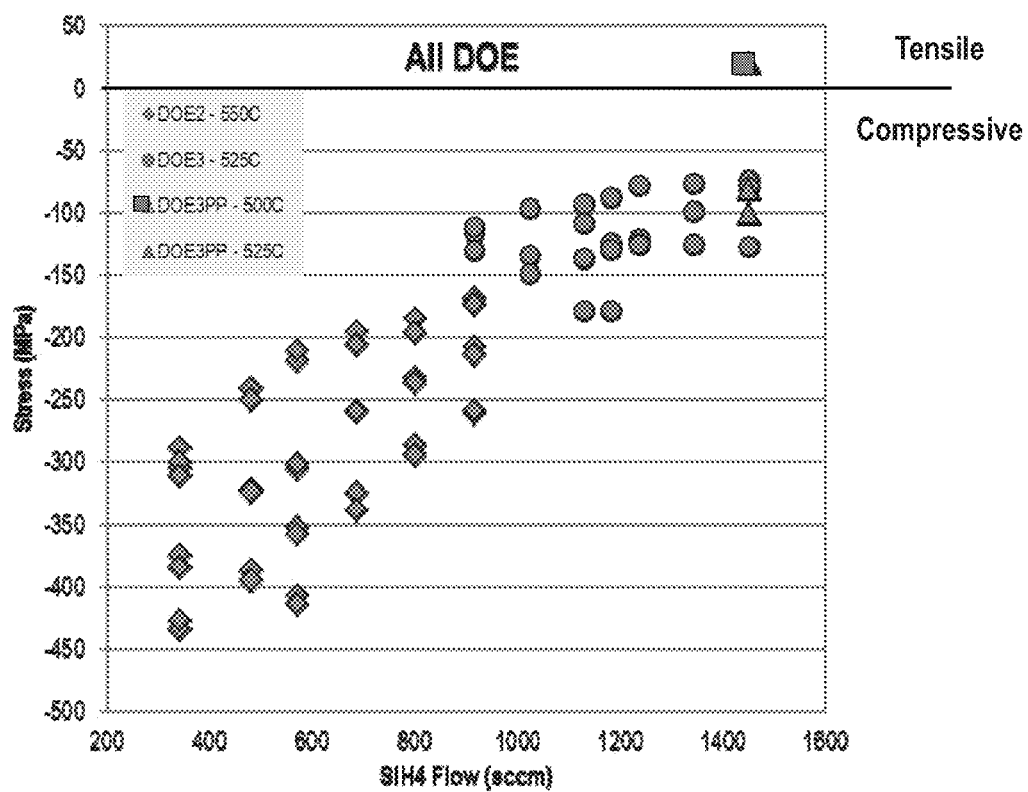
FIGS. 11A-11B show the impact of temperature and silane flow rate on internal stress of the deposited film
Figure 11B:
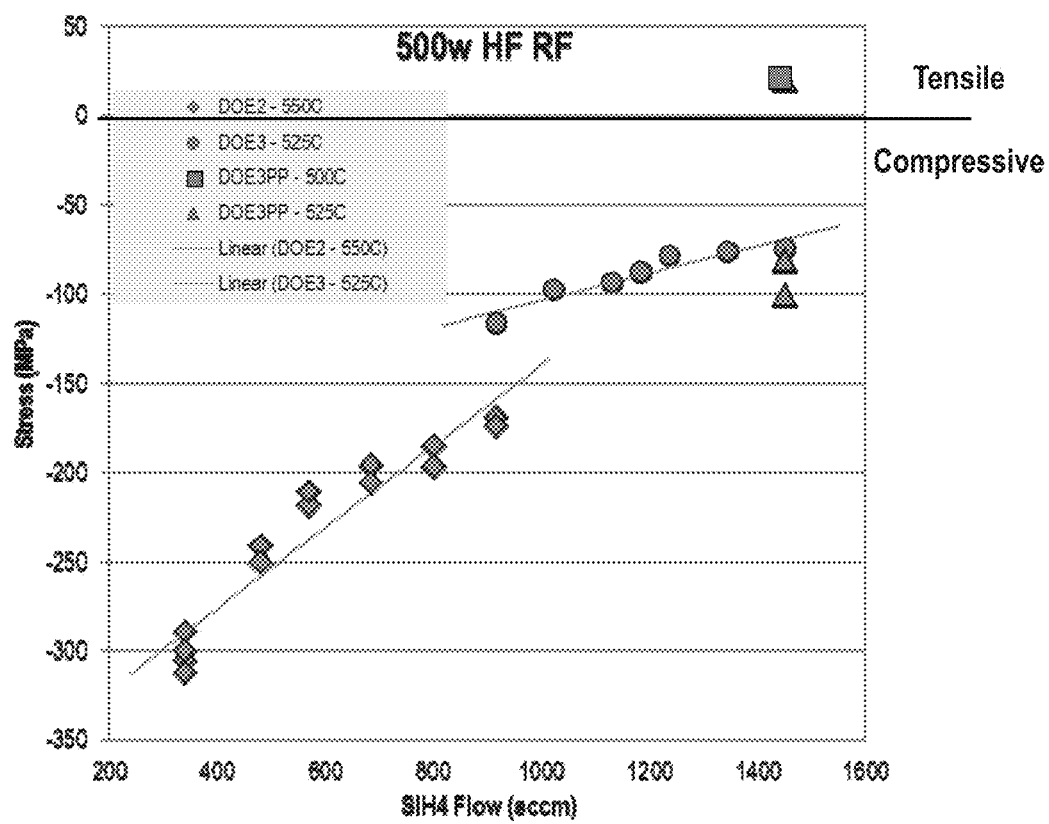

FIGS. 11A and 11B illustrate data at different deposition temperatures. It also shows the data as a function of silane flow rate. Basically they show the impact of temperature and silane flow rate on internal stress of the deposited film. The diamonds shown on the lower left side of the graphs represent data taken at 550° C. and for relatively low silane flow rates. The data shown by the circular dots further up and to the right were generated under experimental condition of 525° C. and at relatively higher silane flow rates. The triangles on the far right represent data obtained at 525° C. and with a relatively high silane flow rate. At that same silane flow rate, data was taken at a deposition temperature of 500° C. This is reflected by the square in the upper right. As can be seen, the data obtained at lower deposition temperatures and higher silane flow rates show the most desirable internal stress values for the deposited silicon film. In fact, the data taken at a flow rate of 1450 sccm and 500° C. actually had a tensile internal stress.

FIG. 11B shows a subset of data in FIG. 11A, showing only data produced with a 500 W of high-frequency RF power. However, the same basic trends can be seen. At relatively high deposition temperatures (e.g., 550° C.), the internal compressive stress decreases with increasing silane flow rate. Further improvements in internal stress can be achieved by lowering the deposition temperature from 550° C. to 525° C. and onward to 500° C.

FIG. 12 show data for a 73-layer stack comprising alternating oxide layers and silane doped silicon layers, starting and ending with oxide. Silicon oxide was deposited to a thickness of 200 Å from a TEOS precursor. Silane doped silicon was deposited at 300 Å from silane and phosphine under various process conditions as described herein.

Figure 12A:
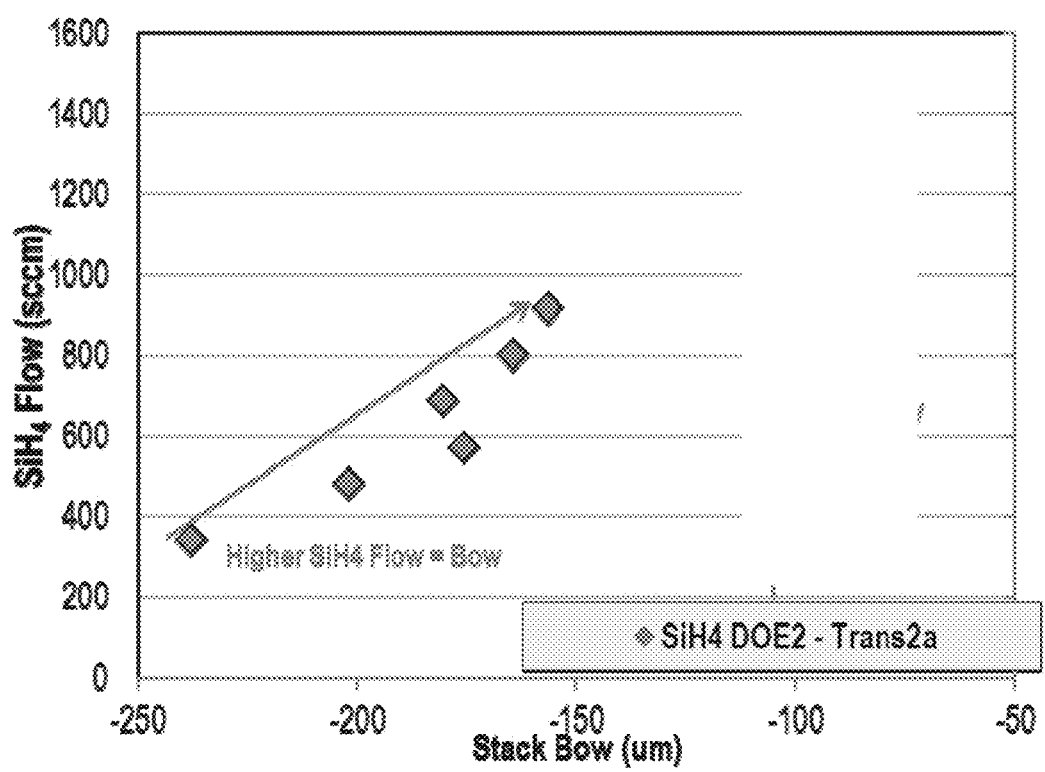
FIGS. 12A-12E show how various processing parameters affect the bow and smoothness of a 73-layer stack comprising alternating oxide layers and silane doped silicon layers.
Figure 12B:
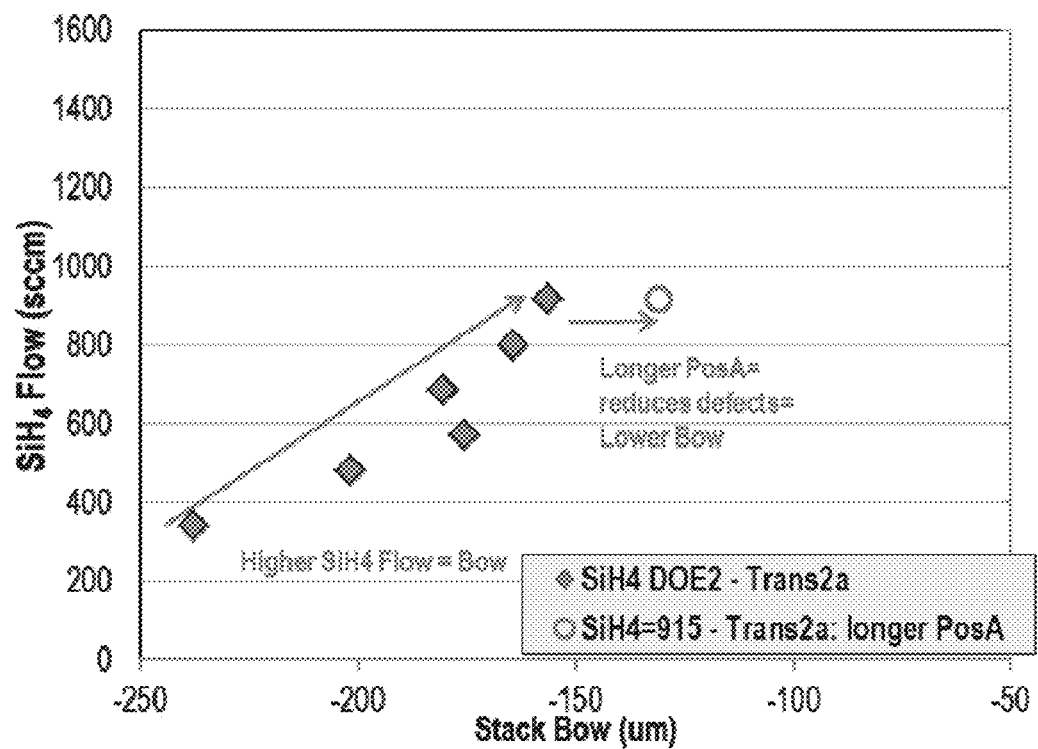

In FIG. 12A, the bow of the 73 layer stack is shown against silane flow rate as indicated by diamond-shaped data points. As can be seen, improvement (reduction) in stack bow was achieved with higher silane flow rates. In FIG. 12B, the bow of the 73 layer stack is shown against silane flow rate as open circle in addition to the data in FIG. 12A, but the experimental condition differs from that of FIG. 12A in that here the PosA is longer, wherein PosA is the time that is post deposition with the HF RF power staying on and silane and dopant flows turned off. As apparent from comparison of the conditions, longer post deposition HF RF power led to reduced bow of the stack.

Figure 12C:
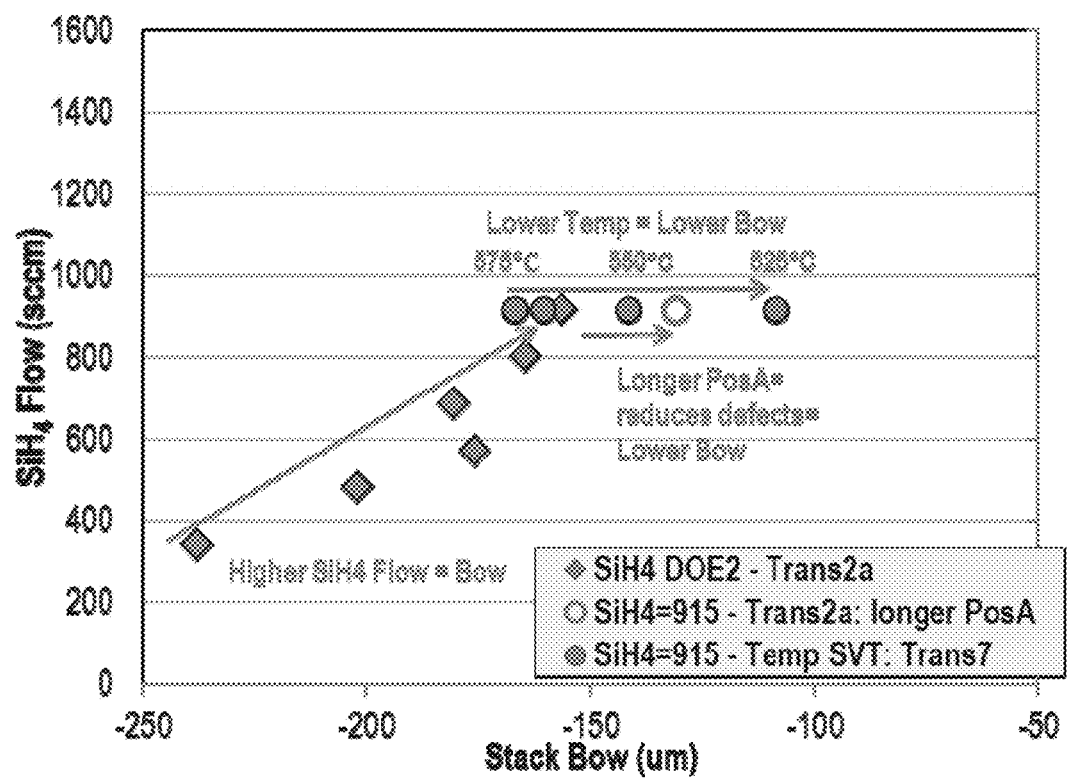

In FIG. 12C, the bow of the 73 layer stack is shown against silane flow rate of about 915 sccm as solid circles in addition to the data in FIG. 12B. Data show that lowering the processing temperature from 575° C. to 525° C. caused the bow to shrink from about −135 μm to about −105 μm.

Figure 12D:
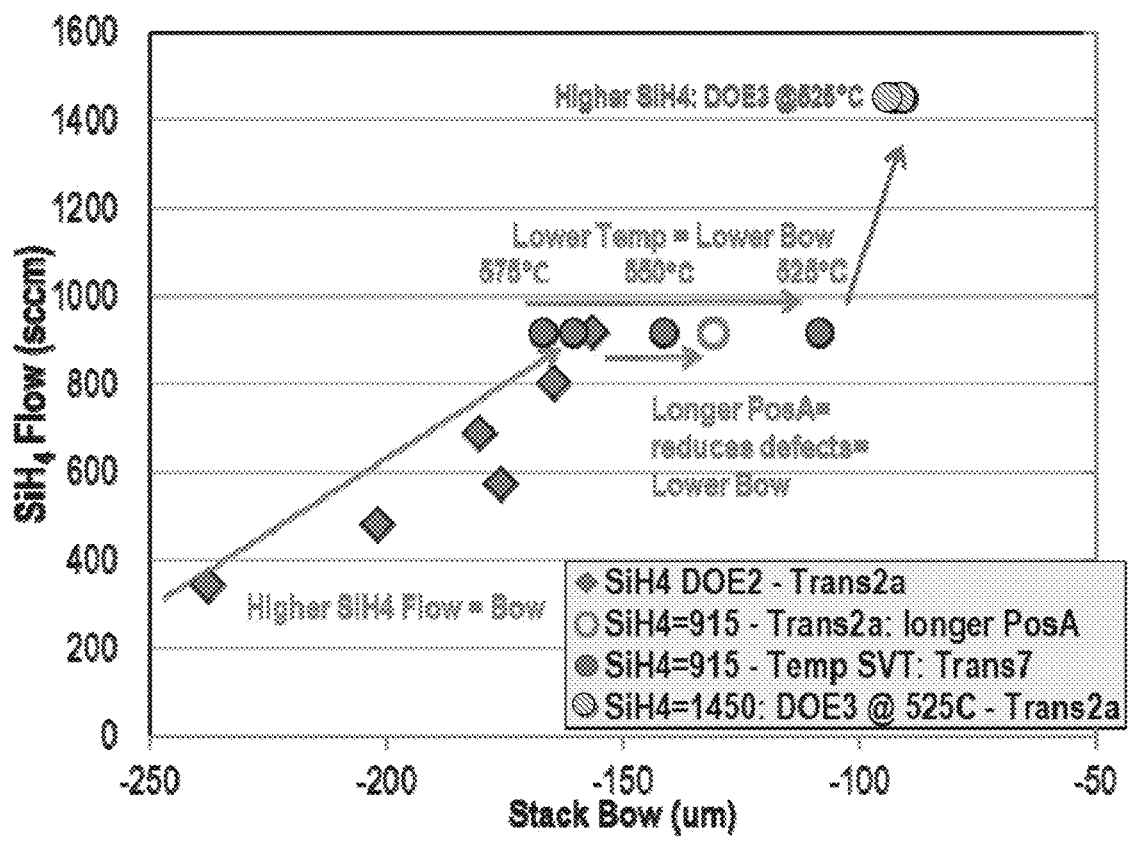

FIG. 12D shows the same data but with additional data points illustrating the impact of even higher silane flow rates at 525° C. As shown by hatched data points, the stack bow improved further with this increased silane flow rate at about 1450 sccm.

Figure 12E:
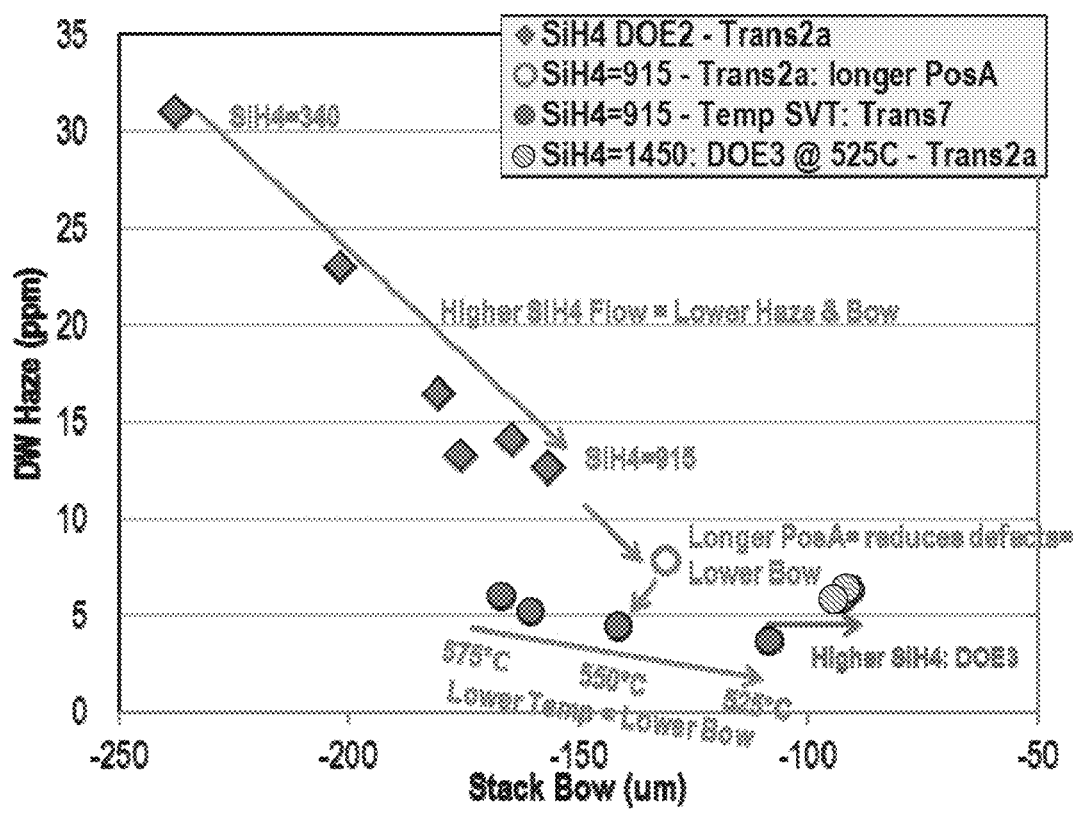

Finally, FIG. 12E depicts the impact of silane flow rate increase and deposition temperature decrease on roughness of the deposited 73 layer stack. As shown, the increase in silane flow rate from 340 to 915 sccm shown by diamond-shaped data points reduced roughness of the stack surface as indicated by haze measured by a KLA-Tencor metrology SP1 tool. Haze is a manifestation of the roughness of the surface. A lower haze value indicates a smoother surface. In addition, longer PosA (see the open-circle data point) and lower processing temperature (see the solid circle data points) also led to lower haze and roughness. Further increasing silane flow rate to 1450 sccm at 525° C. did not further reduce roughness.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:
1. A method of preparing a stack structure for an electronic device on a semiconductor substrate, the method comprising:
  (a) depositing a doped silicon layer on the substrate by introducing a first process gas comprising a silicon hydride and a dopant precursor into a chemical vapor deposition (CVD) apparatus having a plasma, wherein the substrate is held at a temperature of about 450° C. to 550° C., the silicon hydride in the first process gas is introduced at a flow rate of at least about 0.01 sccm/cm$^2$ of substrate deposition surface area, and the doped silicon layer has a compressive stress of less than about 100 MPa or a tensile stress, and a thickness of less than about 500 Å;
  (b) depositing a dielectric layer on the substrate by introducing a second process gas comprising a precursor of the dielectric layer into the CVD apparatus having a plasma, wherein the dielectric layer has a compressive stress of at least about 200 MPa and a thickness of less than about 500 Å; and (c) repeating operations (a) and (b) for two or more times to form a stack structure.

2. The method of claim 1, wherein the silicon hydride comprises silane.

3. The method of claim 2, wherein the dopant precursor comprises phosphine.

4. The method of claim 3, wherein the silicon hydride flow rate in (a) is at least about 1200 sccm or greater for a 300 mm-diameter substrate, or at an equivalent flow rate scaled by substrate deposition surface area.

5. The method of claim 3, wherein the silicon hydride flow rate in (a) is at least about 0.038 sccm/cm$^2$ of substrate deposition surface area.

6. The method of claim 3, wherein the first process gas further comprises helium, and the volume ratio of phosphine to helium is about 5:95.

7. The method of claim 3, wherein depositing the doped silicon layer in (a) is conducted at a pressure of between about 1 and 10 Torr.

8. The method of claim 3, wherein the plasma is provided by powering a high frequency radio power source at about 500 watt or higher.

9. The method of claim 1, wherein the roughness of the doped silicon layer is about 5 Å or less as measured by atomic force microscopy.

10. The method of claim 1, wherein the stack structure comprises amorphous or microcrystalline silicon, and the method further comprises activating the amorphous or microcrystalline silicon by heating, thereby converting the silicon to a polycrystalline state.

11. The method of claim 1, wherein the bulk resistivity of the doped silicon layer after activation is less than about 0.001 ohm·centimeter.

12. The method of claim 1, wherein the CVD apparatus is a plasma-enhanced chemical vapor deposition (PECVD) apparatus.

13. The method of claim 1, wherein the stack structure has a total thickness of between about 1 and 6 micrometers.

14. The method of claim 1, wherein the stack structure comprises at least 50 layers.

15. The method of claim 1, wherein the stack structure is configured to be part of a vertically integrated memory device.

16. The method of claim 1, wherein the stack structure comprises alternating layers of doped silicon and a dielectric material.

17. The method of claim 1, wherein the stack structure comprises alternating layers of doped and undoped silicon.

18. A system for preparing a stack structure for an electronic device on a semiconductor substrate, the system comprising:

(a) a multi-chamber apparatus comprising at least one chemical vapor deposition (CVD) chamber having a plasma for depositing at least one layer of the stack over the semiconductor substrate; and (b) a controller comprising instructions for:

depositing a doped silicon layer on the substrate by introducing a first process gas comprising a silicon hydride and a dopant precursor into a CVD chamber, wherein the substrate is held at a temperature of about 450° C. to 550° C., the silicon hydride in the process gas is introduced at a flow rate of at least about 0.01 sccm/cm$^2$ of substrate deposition surface area, and the doped silicon layer has a compressive stress of less than about 100 MPa or a tensile stress, and a thickness of less than about 500 Å;

depositing a dielectric layer on the substrate by introducing a second process gas comprising a precursor of the dielectric layer into the CVD apparatus having a plasma, wherein the dielectric layer has a compressive stress of at least about 200 MPa and a thickness of less than about 500 Å.

19. The system of claim 18, the multi-chamber apparatus further comprising a rapid thermal annealing chamber.

20. The system of claim 18, wherein the controller comprises instructions for receiving the semiconductor substrate from outside the system and transferring the substrate from one chamber to another in the multi-chamber apparatus.

\* \* \* \* \*